United States Patent
Fleming et al.

(10) Patent No.: US 7,790,353 B2
(45) Date of Patent: Sep. 7, 2010

(54) MULTIDIRECTIONAL PHOTOREACTIVE ABSORPTION METHOD

(75) Inventors: Patrick R. Fleming, Lake Elmo, MN (US); Robert J. DeVoe, Oakdale, MN (US); Catherine A. Leatherdale, St. Paul, MN (US); Todd A. Ballen, St. Paul, MN (US); Jeffrey M. Florczak, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 100 days.

(21) Appl. No.: 10/297,961

(22) PCT Filed: Jun. 14, 2001

(86) PCT No.: PCT/US01/19124

§ 371 (c)(1),
(2), (4) Date: Dec. 12, 2002

(87) PCT Pub. No.: WO01/96959

PCT Pub. Date: Dec. 20, 2001

(65) Prior Publication Data

US 2004/0223385 A1    Nov. 11, 2004

Related U.S. Application Data

(60) Provisional application No. 60/211,675, filed on Jun. 15, 2000.

(51) Int. Cl.
*G11C 7/00* (2006.01)
(52) U.S. Cl. .................. 430/280.1; 430/281.1; 430/320
(58) Field of Classification Search .............. 430/1, 430/2; 359/3; 365/125
See application file for complete search history.

(56) References Cited

U.S. PATENT DOCUMENTS 3,018,262 A    1/1962    Schroeder (Continued)

FOREIGN PATENT DOCUMENTS

DE    2546079    5/1977

(Continued)

OTHER PUBLICATIONS

Belfield et al., Near-IR two photon absorbing dyes and photoinitiated cationic polymerization, Polymer Preprints, vol. 41(1) pp. 578-579 (Mar. 2000).*

(Continued)

*Primary Examiner*—Martin J Angebranndt
(74) *Attorney, Agent, or Firm*—Lucy C. Weiss; Ann M. Mueting

(57) ABSTRACT

A method for enhancing photoreactive absorption in a specified volume element of a photoreactive composition. In one embodiment, the method includes: providing a photoreactive composition: providing a source of light (preferably, a pulsed laser) sufficient for simultaneous absorption of at least two photons by the photoreactive composition, the light source having a beam capable of being divided: dividing the light beam into a plurality of equal path length exposure beams: and focusing the exposure beams in a substantially non-counter propagating manner at a single volume element of the photoreactive composition simultaneously to react at least a portion of the photoreactive composition. In another embodiment, a method includes: providing a photoreactive composition capable of photoreactive absorption: and exposing the photoreactive composition to laser light from a plurality of substantially non-counter propagating directions simultaneously, wherein the light overlaps in time and space at a predetermined focus spot.

32 Claims, 2 Drawing Sheets

U.S. PATENT DOCUMENTS

| | | | |
|---|---|---|---|
| 3,117,099 A | | 1/1964 | Proops et al. |
| 3,635,545 A | * | 1/1972 | VanKerkhove et al. ...... 359/569 |
| 3,677,634 A | | 7/1972 | Mathisen |
| 3,720,921 A | * | 3/1973 | Schools et al. .............. 365/119 |
| 3,729,313 A | | 4/1973 | Smith |
| 3,741,769 A | | 6/1973 | Smith |
| 3,758,186 A | | 9/1973 | Brumm |
| 3,779,778 A | | 12/1973 | Smith et al. |
| 3,806,221 A | | 4/1974 | Kiemle |
| 3,808,006 A | | 4/1974 | Smith |
| 3,954,475 A | | 5/1976 | Bonham et al. |
| 3,987,037 A | | 10/1976 | Bonham et al. |
| 4,041,476 A | | 8/1977 | Swainson |
| 4,078,229 A | | 3/1978 | Swanson et al. |
| 4,228,861 A | | 10/1980 | Hart |
| 4,238,840 A | | 12/1980 | Swainson |
| 4,250,053 A | | 2/1981 | Smith |
| 4,279,717 A | | 7/1981 | Eckberg et al. |
| 4,288,861 A | | 9/1981 | Swainson et al. |
| 4,333,165 A | | 6/1982 | Swainson et al. |
| 4,394,403 A | | 7/1983 | Smith |
| 4,394,433 A | | 7/1983 | Gatzke |
| 4,458,345 A | * | 7/1984 | Bjorklund et al. ........... 369/103 |
| 4,466,080 A | | 8/1984 | Swainson et al. |
| 4,471,470 A | | 9/1984 | Swainson et al. |
| 4,491,628 A | | 1/1985 | Ito et al. |
| 4,496,216 A | | 1/1985 | Cowan |
| 4,515,445 A | | 5/1985 | Muller et al. |
| 4,547,037 A | | 10/1985 | Case |
| 4,588,664 A | | 5/1986 | Fielding et al. |
| 4,614,705 A | | 9/1986 | Umehara |
| 4,642,126 A | | 2/1987 | Zador et al. |
| 4,652,274 A | | 3/1987 | Boettcher et al. |
| 4,666,236 A | | 5/1987 | Mikami et al. |
| 4,775,754 A | | 10/1988 | Vogel et al. |
| 4,859,572 A | | 8/1989 | Farid et al. |
| 4,877,717 A | | 10/1989 | Suzuki et al. |
| 4,963,471 A | | 10/1990 | Trout et al. |
| 5,006,746 A | | 4/1991 | Kasuga et al. |
| 5,034,613 A | | 7/1991 | Denk et al. |
| 5,035,476 A | | 7/1991 | Ellis et al. |
| 5,037,917 A | | 8/1991 | Babb et al. |
| 5,145,942 A | | 9/1992 | Hergenrother et al. |
| 5,159,037 A | | 10/1992 | Clement et al. |
| 5,159,038 A | | 10/1992 | Babb et al. |
| 5,225,918 A | | 7/1993 | Taniguchi et al. |
| 5,235,015 A | | 8/1993 | Ali et al. |
| 5,283,777 A | | 2/1994 | Tanno et al. |
| 5,289,407 A | | 2/1994 | Strickler et al. |
| 5,377,043 A | | 12/1994 | Pelouch et al. |
| 5,405,733 A | | 4/1995 | Sirkin et al. |
| 5,422,753 A | | 6/1995 | Harris |
| 5,446,172 A | | 8/1995 | Crivello et al. |
| 5,478,869 A | | 12/1995 | Takahashi et al. |
| 5,479,273 A | * | 12/1995 | Ramsbottom .................. 359/9 |
| 5,529,813 A | * | 6/1996 | Kobsa et al. ................. 427/517 |
| 5,545,676 A | | 8/1996 | Palazzotto et al. |
| 5,633,735 A | | 5/1997 | Hunter et al. |
| 5,665,522 A | | 9/1997 | Vogel et al. |
| 5,703,140 A | | 12/1997 | Kunita et al. |
| 5,747,550 A | | 5/1998 | Nohr et al. |
| 5,750,641 A | | 5/1998 | Ezzell et al. |
| 5,753,346 A | | 5/1998 | Leir et al. |
| 5,759,721 A | | 6/1998 | Dhal et al. |
| 5,759,744 A | | 6/1998 | Brueck et al. |
| 5,770,737 A | | 6/1998 | Reinhardt et al. |
| 5,832,931 A | * | 11/1998 | Wachter et al. ............. 128/898 |
| 5,847,812 A | | 12/1998 | Ooki et al. |
| 5,854,868 A | | 12/1998 | Yoshimura et al. |
| 5,856,373 A | | 1/1999 | Kaisaki et al. |
| 5,859,251 A | | 1/1999 | Reinhardt et al. |
| 5,864,412 A | | 1/1999 | Wilde |
| RE36,113 E | | 2/1999 | Brueck et al. |
| 5,912,257 A | * | 6/1999 | Prasad et al. ................. 514/356 |
| 5,952,152 A | | 9/1999 | Cunningham et al. |
| 5,998,495 A | | 12/1999 | Oxman et al. |
| 6,005,137 A | | 12/1999 | Moore et al. |
| 6,020,591 A | * | 2/2000 | Harter et al. ............. 250/458.1 |
| 6,025,406 A | | 2/2000 | Oxman et al. |
| 6,025,938 A | | 2/2000 | Kathman et al. |
| 6,030,266 A | | 2/2000 | Ida et al. |
| 6,043,913 A | * | 3/2000 | Lu et al. ....................... 359/25 |
| 6,048,911 A | | 4/2000 | Shustack et al. |
| 6,051,366 A | | 4/2000 | Baumann et al. |
| 6,100,405 A | | 8/2000 | Reinhardt et al. |
| 6,103,454 A | | 8/2000 | Dhar et al. |
| 6,107,011 A | | 8/2000 | Gelbart |
| 6,115,339 A | | 9/2000 | Winarski |
| 6,215,095 B1 | | 4/2001 | Partanen et al. |
| 6,262,423 B1 | | 7/2001 | Hell et al. |
| 6,267,913 B1 | | 7/2001 | Marder et al. |
| 6,297,910 B1 | * | 10/2001 | Xuan et al. .................. 359/618 |
| 6,312,876 B1 | | 11/2001 | Huang et al. |
| 6,316,153 B1 | | 11/2001 | Goodman et al. |
| 6,322,931 B1 | | 11/2001 | Cumpston et al. |
| 6,322,933 B1 | | 11/2001 | Daiber et al. |
| 6,327,074 B1 | * | 12/2001 | Bass et al. ................... 359/326 |
| 6,441,356 B1 | * | 8/2002 | Mandella et al. ......... 250/201.3 |
| 6,469,755 B1 | | 10/2002 | Adachi et al. |
| 6,541,591 B2 | | 4/2003 | Olson et al. |
| 6,573,026 B1 | * | 6/2003 | Aitken et al. ................ 430/290 |
| 6,608,228 B1 | | 8/2003 | Cumpston et al. |
| 6,618,174 B2 | | 9/2003 | Parker et al. |
| 6,624,915 B1 | * | 9/2003 | Kirkpatrick et al. ............ 359/3 |
| 6,703,188 B1 | | 3/2004 | Kagami et al. |
| 6,750,266 B2 | | 6/2004 | Bentsen et al. |
| 6,852,766 B1 | | 2/2005 | DeVoe |
| 6,855,478 B2 | | 2/2005 | DeVoe et al. |
| 7,014,988 B2 | | 3/2006 | DeVoe et al. |
| 7,026,103 B2 | | 4/2006 | DeVoe et al. |
| 7,060,419 B2 | | 6/2006 | Bentsen et al. |
| 7,166,409 B2 | | 1/2007 | Fleming et al. |
| 2002/0034693 A1 | * | 3/2002 | Fukuda et al. .................. 430/1 |
| 2003/0155667 A1 | | 8/2003 | DeVoe et al. |
| 2004/0012872 A1 | | 1/2004 | Fleming et al. |
| 2004/0067431 A1 | | 4/2004 | Arney et al. |
| 2005/0009175 A1 | | 1/2005 | Bergh et al. |
| 2005/0054744 A1 | | 3/2005 | DeVoe |
| 2006/0078831 A1 | | 4/2006 | DeVoe et al. |
| 2007/0087284 A1 | | 4/2007 | Fleming et al. |

FOREIGN PATENT DOCUMENTS

| | | | |
|---|---|---|---|
| DE | 41 42 327 | | 6/1993 |
| DE | 42 19 376 | | 12/1993 |
| DE | 4326473 | * | 2/1995 |
| DE | 19653413 | | 6/1998 |
| JP | 62-097791 | | 5/1989 |
| JP | 05-288992 | | 11/1993 |
| JP | 06265710 A | | 9/1994 |
| WO | WO 92/00185 | | 1/1992 |
| WO | WO 97/27519 | | 7/1997 |
| WO | WO 98/21521 | | 5/1998 |
| WO | WO 98/28775 | | 7/1998 |
| WO | WO 99/23650 | | 5/1999 |
| WO | WO 99/53242 | | 10/1999 |
| WO | WO 99/54784 | | 10/1999 |
| WO | WO 02/079691 | | 10/2002 |

OTHER PUBLICATIONS

Belfield et al., "multiphoton-absorbing organic material for microfabrication, emerging optical applications and non-destructive three dimensional imaging", J. Phys. Org. Chem., vol. 13, pp. 837-849 (2000).*

Grime, G.W., "holographic diffraction gratings recorded in photoresist", in Non-Silver Photographic Processes, Cox,Ed. (1975) pp. 275-285.*
Hell et al., "Fundamental improvement of resolution with a 4Pi-confacl fluorescence microscope using two photon excitation". Opt. Commun. vol. 93 (5,6) pp. 277-282 (1992).*
U.S. Appl. No. 60/211,708.*
Webpage Journal of Physical Organic Chemistry, vol. 13, issue 12, (Dec. 2000) "Published online: Nov. 9, 2000" (3 pages).*
Lindek et al. "resolution improvement by non confocal theta microscopy", Opt. Lett., vol. 24(21) pp. 1505-1507 (Nov. 1999).*
Lakowicz et al., "Fluorescence spectral properties of . . . ", J. Phys. Chem., vol. 100(50) pp. 19406-19411 (1996).*
Cambaliza et al., Opt. Commun. vol. 184(1-4) pp. 25-35 (Oct. 2000).*
Lindek et al. "Two new high-resolution confocal fluorescence microscopies (4Pi, Theta) with one- and two-photon excitation" in Handbook of Biological Confocal Microscopy, J. Pawley Ed, pp. 417-430 (1995).*
Lindek et al. "confocal theta microscopy and 4Pi-confocal theta microscopy" Proc. SPIE 2184 , pp. 188-194 (1994).*
R. D. Allen, G. M. Wallraff, W. D. Hinsberg, and L. L. Simpson in High Performance Acrylic Polymers for Chemically Amplified Photoresist Applications, *J. Vac. Sci. Technol.* B, 9, 3357 (1991).
C. Xu and W. W. Webb in *J. Opt. Soc. Am. B*, 13, 481 (1996).
R. D Allen et al. in *Proc. SPIE* 2438, 474 (1995).
I. B. Berlman in *Handbook of Fluorescence Spectra of Aromatic Molecules*, Second Edition, pp. 24-27, Academic Press, New York (1971).
J. N. Demas and G. A. Crosby in *J. Phys. Chem.* 75, 991-1024 (1971).
J. V. Morris, M. A. Mahoney, and J. R. Huber in *J. Phys. Chem. 80*, 969-974 (1976).
*Bull. Chem. Soc.* Japan, 42, 2924-2930 (1969), Wakabayashi et al.
Large, *Photographic Sensitivity*, Academic Press (1973), R.J. Cox, ed., pp. 241-263.
D. F. Eaton in *Advances in Photochemistry*, B. Voman et al., vol. 13, pp. 427-488, (1986).
Beringer et al., *J. Am. Chem. Soc. 81*, 342 (1959).
Makukha et al., Two-Photon-Excitation Spatial Distribution for Cross Focused Gaussian Beams, *Applied Optics*, vol. 40, No. 23, pp. 3932-3936 (Aug. 10, 2001).
Bunning et al. Electronically Switchable Grating Formed Using Ultrafast Holographic Two-Photon-Induced Photopolymerization, *Chem. Mater.*, 2000, pp. 2842-2844.
Diamond et al., Two-Photon Holography in 3-D Photopolymer Host-Guest Matrix, *Optics Express*, vol. 6, No. 3, Jan. 31, 2000, pp. 64-68.
Diamond et al., Two-Photon Holography in 3-D Photopolymer Host-Guest Matrix: errata ,*Optic Express*, vol. 6, No. 4, Feb. 14, 2000, pp. 109-110.
Ashley et al., Holographic Data Storage, *IBM J. Res. Develop.* vol. 44, No. 3, May 2000, pp. 341-368.
Belfield et al., Near-IR Two-Photon Photoinitiated Polymerization Using a Fluorone/Amine Initiating System, *J. Am. Chem. Soc.*, 2000, 122 pp. 1217-1218.
Campagnola et al., 3-Dimensional Submicron Polymcrization of Acrylamide by Multiphoton Excitation of Xanthene Dyes, *Macromolecules*, 2000, vol. 33, pp. 1511-1513.
Hong-Bo Sun et al., Three-dimensional Photonic Crystal Structures Achieved With Two-Photon-Absorption Photopolymerization of Material, *Applied Physics Letters*, vol. 74, No. 6, Feb. 8, 1999, pp. 786-788.
Cumpston et. al. Two-Photon Polymerization Initiators For Three-Dimensional Optical Data Storage and Microfabrication, *Nature*, vol. 398, Mar. 4, 1999, pp. 51-54.
Joshi et al., Three-dimensional Optical Circuitry Using Two-Photo-Assisted Polymerization,*Applied Physics Letters*, vol. 74, No. 2, Jan. 11, 1999, pp. 170-172.
Bunning et al., Electrically Switchable Grating Formed Using Ultrafast Holographic Two-Photon-Induced Photopolymerization, *Chem. Mater.* 2000, vol. 12, pp. 2842-2844.
Kirkpatrick et al. Holographic Recording Using Two-Photon-Induced Photopolymerization, *Appl. Phys. A*, vol. 69, pp. 461-464, 1999.

Maruo s et al., Movable Microstructures made by Two-Photon Three-Dimensional Microfabrication, 1999 *International Symposium on Micromechatronics and Human Science*, vol. 23, pp. 173-178 XP002191032.
Kuebler S M et al., Three-Dimensional Microfabrication Using Two-Photon Activated Chemistry, *SPIE* vol. 3937, pp. 97-105, Jan. 27, 2000 XP008000209.
Cumpston B H et al., New Photopolmers Based on Two-Photon Absorbing Chromophores and Application to Three-Dimensional Microfabrication and Optical Storage, *Mat. Res. Soc. Symp. Proc.*, vol. 488, pp. 217-225, 1998, XP008000191.
Kawata S. et al., Photon-Iduces Micro/Nano Fabrication, Manipulation and Imaging with Unconvential Photo-Active Systems, *Mol. Cryst. Liq. Cryst.*, vol. 314, pp. 173-178, Aug. 25, 1997, XP001059839.
Tanaka et al., Three-Dimensional Fabrication and Observation of Micro-Structures Using Two-Photon Absorption and Fluorescence, *SPIE*, vol. 3937, pp. 92-96, Jan. 27, 2000, XP001051866.
Wenseleers et al., Five Orders-of-Magnitude Enhancement of Two-Photon Absorption for Dyes on Silver Nanoparticle Fractal Clusters, *J. Phys. Chem. B*, vol. 106, pp. 6853-6863, 2002.
Zhou et al.. Efficient Photacids Based Upon Triarylamine Dialkylsulfonium Salts, *J. Am. Chem. Soc.*, vol. 124, No. 9, pp. 1897-1901.
Zhou et al., An Efficient Two-Photon-Generated Photoacid Applied To Positive-Tone 3D Microfabrication, *Science*, vol. 296, pp. 1106-1109, May 10, 2002.
Stellacci et al., Laser and Electon-Beam Induced Growth of Nanoparticles for 2D and 3D Metal Patterning, *Adv. Mater.*, vol. 14, No. 3, pp. 194-198, Feb. 2002.
Watanabe et al., Photoreponsive Hydrogel Microstructure Fabricated by Two-Photon Initiated Polymerization, *Adv. Func. Mater.*, vol. 12, No. 9, pp. 611-614, Sep. 2002.
Hong-Bo Sun, Real Three-Dimensional Microstructures Fabricated by Photpolymerization of Resins Through Two-Photon Absorption, *Optical Letters*, vol. 25, No. 5, pp. 1110-1112, Aug. 2000.
Misawa et al., Microfabrication by Femtosecond Laser Irradiation, *SPIE,*, vol. 3933, pp. 246-260, 2000.
Miwa, Femtosecond Two-Photon Stereo-Lithography, *Applied Physics A*, vol. 73, No. 5, pp. 561-566, 2001.
Kawata et al., Two-Photon Photopolymerization of Functional Micro-Devices, *Journal of Photopolymer Science and Technology*, vol. 15, No. 3, pp. 471-474, 2002.
Boiko et al., Thresold Enhancement in Two-Photon Photopolymerization, *SPIE*, vol. 4097, pp. 254-263, 2000.
Belfield et al., Multiphoton-Absorbing Organic Materials For Microfabrication, emerging Optical Applications and Non-Destructive Three-Dimensional Imaging, *J. Phys. Org.*,vol. 13, pp. 837-849, 2000.
Serbin et al., Femtosecond Laser-Induced Two-Photon Polymerization of Inorganic-Organic Hybrid Materials for Applications in Photonics, *Optics Letters*, vol. 28, No. 5, pp. 301-303, Mar. 2003.
Davidson, The Chemistry of Photoinitiators Some Recent Developments, *J. Photochem. Photobiol. A.*, vol. 73, pp. 81-96, 1993.
Dektar et al., Photochemistry of Triarylsulfonium Salts, *J. Am. Chem. Soc.*, vol. 112, pp. 6004-6015, 1990.
Denk et al., Two-Photon Laser Scanning Fluorescence Microscopy, *Science*, vol. 248, pp. 73-76, Apr. 1990.
Dvornikov et al., Two-Photon Three-Dimensional Optical Storage Memory, *Advances in Chemistry Series*, vol. 240, pp. 161-177, 1994.
Goppert-Mayer, Uber Elmentarakte Mit zwei Quantesprungen, *Ann. Phys.*, vol. 9, pp. 273-294, 1931.
Ito, Chemical Amplification Resists: History and Development Within IBM, *IBM J. Res. Develop.*, vol. 41, No. ½, pp. 69-80, Mar. 1997.
Jenkins et al., *Fundamentals of Optics*, 3rd Edition, McGraw-Hill, New York, pp. 331, 1957.
Kavarnos et al., Photosensitization by Reversible Electron Transfer : Theories, Experimental Evidence, and Examples, *Chem. Rev.*, vol. 86, pp. 401-449, Apr. 1986.
Kennedy et al., p-Bis(o-methylstyryl) benzene as a Power-Squared Sensor for Two-Photon Absorption Measurements between 537 and 694 nm, *Anal. Chem.*, vol. 58, pp. 2643-2647, 1986.

Kewitsch et al., Self-Focusing and Self-Trapping of Optical Beams Upon Photopolymerization, *Optics Letters*, vol. 21, No. 1, pp. 24-26, Jan. 1996.

Lee et al., Micromachining Applications of a High Resolution Ultrathick Photoresist, *J. Vac. Sci. Technol. B*, vol. 13, pp. 3012-3016, Dec. 1995.

Lipson et al., Nature of the Potential Energy Surfaces for the Sn1 Reaction A Picosecond Kinetic Study of Homolysis and Heterolysis for Diphenylmethyl Chlorides, *J. Am. Chem. Soc.*, vol. 118, pp. 2992-2997, 1996.

Lorenz et al., SU-8: a low cost negative resist for MEMS, *J. Micromech. Microeng.*, vol. 7, pp. 121-124, 1997.

Maiti et al., Measuring Serotonin Distribution in Live Cells with Three-Photon Excitation, *Science*, vol. 275, pp. 530-532, Jan. 1997.

March., *Advanced Organic Chemistry: Reactions, Mechanisms and Structure*, Four Edition, 1992, Wiley-Interscience, New York, p. 205.

March, *Advanced Organic Chemistry: Reactions, Mechanisms and Structure*, Four Edition, 1992, Wiley-Interscience, New York, Chapter 2.

March, *Advanced Organic Chemistry: Reactions, Mechanisms and Structure*, Four Edition, 1992, Wiley-Interscience, New York, Chapter 9.

Maruo et al., Two-Photon-Absorbed Photopolymerization for Three-Dimensional Microfabrication, *IEEE, The Tenth Annual International Workshop on Micro Electro Mechanical Systems*, pp. 169-174, 1997.

Maruo et al., Three-Dimensional Microfabrication With Two-Photon-Absorbed Photopolymerization, *Optics Letters*, vol. 22, No. 2, pp. 132-134, Jan. 1997.

McClelland et al., Laser Flash Photolysis of 9-Fluorenol. Production and Reactivities of the 9-Fluorenol Radical Cation and the 9-Fluorenyl Cation, *J. Am. Chem. Soc.*, vol. 112, pp. 4857-4861, 1990.

McClelland et al., Flash Photolysis Study of a Friedel-Crafts alkylation. Reaction of the Photogenerated 9-Fluorenyl cation with aromatic compounds, *J. Chem. Soc.*, vol. 2, pp. 1531-1543, 1996.

Odian, *Principles of Polymerization Second Edition* John Wiley & Sons, New York, 1981, pp. 181.

Richardson, Langmuir-Blodgett Films, *An Introduction to Molecular Electronics*, Chapter 10, 1995.

Pitts et al., Submicro Multiphoton Free-Form Fabrication of Proteins and Polymers : Studies of Reaction Efficiencies and Applications in Sustained Release, *Macromolecules*, vol. 33, pp. 1514-1523, 2000.

He et al., Two-Photon Absorption and Optical-Limiting Properties of Novel Organic Compounds, *Optics Letters*, vol. 20, No. 5, pp. 435-437, Mar. 1995.

Parthenopoulos et al., Three-Dimensional Optical Storage Memory, *Science*, vol. 245, pp. 843-845, Aug. 1989.

Shaw et al., Negative Photoresists for Optical Lithography, *IBM J. Res. Develop.*, vol. 41, No. 1/2, pp. 81-94, Jan./Mar. 1997.

Shirai et al., Photoacid and Photobase Generators : Chemistry and Applications to Polymeric Materials, *Prog. Polym. Sci.*, vol. 21, pp. 1-45, 1996.

Smith, *Modern Optic Engineering*, 1966, McGraw-Hill, pp. 104-105.

Strickler et al., Three-Dimensional Optical Data Storage in Refractive Media by Two-Photon Point Excitation, *Optics Letters*, vol. 16, No. 22, pp. 1780-1782, Nov. 1991.

Strickler et al., 3-D Optical Data Storage by Two-Photon Excitation, *Adv. Mater.*, vol. 5, No. 6, pp. 479, 1993.

Thayumanavan et al., Synthesis of Unsymmetrical Triarylamines for Photonic Applications via One-Pot Palladium-Catalyzed Aminations, *Chem. Mater.*, vol. 9, pp. 3231-3235, 1997.

Wan et al., Contrasting Photosolvolytic Reactivities of 9-Fluorenol vs. 5-Suberenol Derivatives. Enhanced Rate of Formation of Cyclically Conjugated Four π Carbocations in the Excited State, *J. Am. Chem. Soc.*, vol. 111, pp. 4887-4895, 1989.

Williams et al., Two-Photon Molecular Excitation Provides Intrinsic 3-Dimensional Resolution for Laser-based Microscopy and Microphotochemistry, *FASEB Journal*, vol. 8, pp. 804-813, Aug. 1994.

Xu et al., Multiphoton Fluorescence Excitation: New Spectral Windows for Biological Nonlinear Microscopy, *Proc. Natl. Acad. Sci. USA*, vol. 93, pp. 10763-10768, Oct. 1996.

Yuste et al., Dendritic Spines as Basic Functional Units of Neuronal Integration, *Nature*, vol. 375, pp. 682-684, Jun. 1995.

Kosar, Photochemical Formation and Destruction of Dyes, *Light-Sensitive Systems*, John Wiley & Sons, New York, NY, 1965, Chapter 8.

Badlwinson, Auxiliaries Associated With Main Dye Classes, *Colorants and Auxiliaries*, vol. 2, 1990, Chapter 12.

Syper et al., Synthesis of Oxiranylquinones as New Potential Bioreductive Alkylating Agents, *Tetrahedron*, vol. 39, No. 5, pp. 781-792, 1983.

Zollinger, *Color Chemistry*, VCH, Weinheim, GE, 1991, Chapter 8.

Misawa et al., Multibeam Laser Manipulation and Fixation of Microparticles, *Appl. Phys. Letter*, vol. 60, No. 3, pp. 310-312, Jan. 20, 1992. (XP 002189602).

Sun et al., Photonic Crystal Structures With Submicrometer Spatial Resolution Achieved by High Power Femtosecond Laser-Induced Photopolymerization, *SPIE*, vol. 3888, pp. 122-130, 2000. (XP 001051864).

Clark et al., "Fiber delivery of femtosecond pulses from a Ti:sapphire laser," Opt. Lett., vol. 26(17); pp. 1320-1322 (Sep. 1, 2001).

Hitz, "Hollow fiber delivers distortion free femtosecond pulses," Opt. Lett., vol. 29 (11); pp. 1285-1287 (Jun. 2004) [retrieved on Aug. 30, 2005. Retrieved from the Internet: <http:www.photonics.com/spectra/research/XQ/ASP/preaid.194/QX/read.htm>].

"Corning SNF-28 optical fiber Product Information" datasheet. Corning Incorporated, New York, 2002 (Product Brochure PI1036, Issued: Apr. 2002, Supersedes: Dec. 2001, ISO 9001 Registered) 4 pgs.

Bogdanov et al., "Parallel, confocal, and complete spectrum imager for fluorescent detection of high density micro array", Proc. SPIE vol. 3605 pp. 298-307 (Jan. 1999).

Payne et al. "High intensity laser beam attenuation based upon two-step absorption mechanism". J. Appl. Phys. vol. 72(9) pp. 4281-4287 (Nov. 1992).

Kato et al., "Multiple-spot parallel processing for laser micronanofabrication," Applied Physics Letters, 2005; 86:044102-1 to 044102-3.

Ichihara et al., "High-Speed Confocal Fluorescence Microscopy Using a Nipkow Scanner with Microlenses for 3-D Imaging of Single Fluorescent Molecule in Real Time," *Bioimages*, Jun. 1996;4(2):57-62.

Tiziani et al., "Three-dimensional analysis by a microlens-array confocal arrangement," *Applied Optics*, Feb. 1, 1994;33(4):567-572.

Buist et al., "Real time two photon absorption microscopy using multi-point excitation", J., Microsc. vol. 192(2) pp. 217-226 (Nov. 1998).

"Gaussian Beam Propagation," CVI Melles Griot Inc., Albuquerque, NM, copyright 2002, retrieved from the internet at <http://www.mellesgriot.com/products/optics/gb_2_3.htm> on Nov. 20, 2009, 7 pgs.

\* cited by examiner

MULTIDIRECTIONAL PHOTOREACTIVE ABSORPTION METHOD

STATEMENT OF PRIORITY

This application claims the priority of U.S. Provisional Application No. 60/211,708 filed Jun. 15, 2000, the contents of which are hereby incorporated by reference.

FIELD

This invention relates to a method of enhancing the peak power of a light source (e.g., a short pulse laser) used in a photoreactive absorption (e.g., reacting) process, the method comprising splitting the light from the light source into a plurality of parts and focusing the parts at the same volume element of a photoreactive composition from a plurality of directions.

BACKGROUND

Molecular two-photon absorption was predicted by Goppert-Mayer in 1931. Upon the invention of pulsed ruby lasers in 1960, experimental observation of two-photon absorption became a reality. Subsequently, two-photon excitation has found application in biology and optical data storage, as well as in other fields.

There are two key differences between two-photon-induced photoprocesses and single-photon induced processes. Whereas single-photon absorption scales linearly with the intensity of the incident light, two-photon absorption scales quadratically. Higher-order absorptions scale with a related higher power of incident intensity. As a result, it is possible to perform photoreactive processes with three-dimensional spatial resolution. Also, because photoreactive processes involve the simultaneous absorption of two or more photons, the absorbing chromophore is excited with a number of photons whose total energy equals the equals the energy of an excited state of a photoreactive photosensitizer, even though each photon individually has insufficient energy to excite the chromophore. Because the exciting light is not attenuated by single-photon absorption within a photoreactive matrix or material, it is possible to selectively excite molecules at a greater depth within a material than would be possible via single-photon excitation by use of a beam that is focused to that depth in the material. These two phenomena also apply, for example, to excitation within tissue or other biological materials.

Major benefits have been achieved by applying photoreactive absorption to the areas of photoreacting and microfabrication. For example, in photoreactive lithography or stereolithography, the nonlinear scaling of photoreactive absorption with intensity has provided the ability to write features having a size that is less than the diffraction limit of the light utilized, as well as the ability to write features in three dimensions (which is also of interest for holography). Such work has been limited, however, to slow writing speeds and high laser powers. At high laser powers, one-photon absorption may occur causing local heating and/or sample damage. Thus there is a need to enhance the peak intensity at the volume of interest while keeping the overall intensity low elsewhere.

Furthermore, the z-axis resolution in two photon microfabrication may be limited by the material but more usually is defined by the optics. In most of the published art, the depth of the reacted voxel (the smallest three dimensional volume element) is defined by the numerical aperture (NA) of the focusing optics and is proportional to the square of the NA. The lateral extent of the reacted voxel is directly proportional to the NA, so the depth and width of the reacted voxel cannot be varied independently (at a fixed wavelength). Creating a shallow depth of field necessitates a small lateral dimension to the voxel, and a small voxel means longer writing times for large structures.

S. Hell and E. H. K. Stelzer in "Fundamental Improvement of Resolution With a 4Pi-Confocal Fluorescence Microscope Using Two-Photon Excitation", *Optics Communications*, 93, 277-282 (1992), describe using interference between two counter propagating beams, that is two beams with the propagating vectors at 180 degrees to each other, to enhance the z-axis resolution in two-photon fluorescence microscopy. In International Publication No. WO 99/54784 by Goodman and Campagnola, the use of two counter propagating beams is described with regards to enhanced z-axis resolution of a two photon microfabrication process. The described apparatus involves two high numerical aperture microscope objectives on opposite sides of a sample on a moveable stage. Such a configuration allows limited choice in the shape of the reacted region. Furthermore, it may not be used with non-transparent substrates.

Thus, there is a need for alternative methods of achieving spatial localization without sacrificing writing speed or flexibility in substrate choice. in exposing photoreactive absorption compositions.

SUMMARY

The present invention provides methods for enhancing photoreactive absorption in a specified volume element of a photoreactive composition. In one embodiment, the method includes: providing a photoreactive composition; providing a source of light (preferably, a pulsed laser) sufficient for simultaneous absorption of at least two photons by the photoreactive composition, the light source having a beam capable of being divided; dividing the light beam into a plurality of equal path length exposure beams; and focusing the exposure beams in a substantially non-counter propagating manner at a single volume element of the photoreactive composition simultaneously to react at least a portion of the photoreactive composition.

In another embodiment, a method includes: providing a photoreactive composition capable of photoreactive absorption; and exposing the photoreactive composition to laser light from a plurality of substantially non-counter propagating directions simultaneously, wherein the light overlaps in time and space at a predetermined focus spot.

In one embodiment, the photoreactive composition is exposed to the light source in a manner such that beams of light are directed from opposite sides of the photoreactive composition. In another embodiment, the beams come from the same side of the composition It is an advantage of the invention that more efficient use of high power laser light, for example, in a photoreactive-absorbing process (preferably, one that involves reacting of a photoreactive composition) can be obtained by dividing the light beam into a plurality of exposure beams, then directing the exposure beams toward a single focus spot. This can be accomplished by use of an appropriate optical element, such as a beam splitter or a holographic element.

A photoreactive composition of the present invention includes a reactive species, which is preferably a photoreactive species, such as monomers, oligomers, reactive polymers, and mixtures thereof, although non-photoreactive species are also possible. Preferred examples of a curable species include addition-polymerizable monomers and oligomers, addition-crosslinkable polymers, cationically-polymerizable monomers and oligomers, cationically-crosslinkable polymers, and mixtures thereof.

Preferably, the photoreactive composition also includes a photoreactive photosensitizer. Preferably, the photoreactive photosensitizer has a two-photon absorption cross-section greater than about $50 \times 10^{-50}$ cm$^4$ sec/photon, more preferably, greater than about $75 \times 10^{-50}$ cm$^4$ sec/photon, even more preferably, greater than about $100 \times 10^{-50}$ cm$^4$ sec/photon, even more preferably, greater than about $150 \times 10^{-50}$ cm$^4$ sec/photon, and most preferably, greater than about $200 \times 10^{-50}$ cm$^4$ sec/photon. Preferably, the photoreactive photosensitizer has a two-photon absorption cross-section greater than about 1.5 times that of fluorescein, more preferably, greater than about 2 times that of fluorescein, even more preferably, greater than about 3 times that of fluorescein, and most preferably, greater than about 4 times that of fluorescein.

A preferred photoreactive composition includes about 5% to about 99.79% by weight of the at least one reactive species, about 0.01% to about 10% by weight of the at least one photoreactive photosensitizer, up to about 10% by weight of the at least one electron donor compound, and about 0.1% to about 10% by weight of the at least one photoinitiator, based upon the total weight of solids.

The present invention also provides a method for enhancing photoreactive absorption in a specified volume element of a photoreactive composition, the method including; providing a photoreactive composition; providing light sufficient for simultaneous absorption of at least two photons by the photoreactive composition; the light including at least two exposure beams; focusing the exposure beams in a substantially non-counter propagating manner at a single volume element of the photoreactive composition simultaneously to react at least a portion of the photoreactive composition. Preferably, the light includes one or more lasers, each of which provides at least one exposure beam.

In preferred embodiments, the methods can utilize optical delay elements to control the relative delay between each pulse and the location of the focal point of each beam.

DEFINITIONS

As used herein:

"photoreactive absorption" means simultaneous absorption of two or more photons to reach a reactive, electronic excited state that is energetically inaccessible by the absorption of a single photon of the same energy;

"simultaneous" means two events that occur within the period of $10^{-14}$ second or less;

"electronic excited state" means an electronic state of a molecule that is higher in energy than the molecule's electronic ground state, that is accessible via absorption of light, and that has a lifetime greater than $10^{-13}$ seconds;

"react" means to effect reacting (polymerization and/or crosslinking) as well as to effect depolymerization or other reactions.

"optical system" means a system for controlling light, the system including at least one element chosen from refractive optical elements such as lenses, reflective optical elements such as mirrors, and diffractive optical elements such as gratings. Optical elements shall also include diffusers, waveguides, and other elements known in the optical arts;

"exposure system" means an optical system plus a light source;

"sufficient light" means light of sufficient intensity and appropriate wavelength to effect photoreactive absorption;

"photosensitizer" means a molecule that lowers the energy required to activate a photoinitiator by absorbing light of lower energy than is required by the photoinitiator for activation and interacting with the photoinitiator to produce a photoinitiating species therefrom;

"photochemically effective amounts" (of the components of the photoinitiator system) means amounts sufficient to enable the reactive species to undergo at least partial reaction under the selected exposure conditions (as evidenced, for example, by a change in density, viscosity, color, pH, refractive index, or other physical or chemical property);

"transit" means passing light completely through a volume of a photoreactive composition; and "focus" or "focusing" means bringing collimated light to a point or forming an image of an object.

DETAILED DESCRIPTION OF PREFERRED EMBODIMENTS

A preferred system for photoreactive absorption can include an exposure system that includes a light source and an appropriate optical element, and a photoreactive composition that includes at least one reactive species, at least one photoreactive photosensitizer, optionally at least one electron donor compound, and optionally at least one photoinitiator for the photoreactive composition. The photoinitiator is typically optional except when the reactive species is a cationic resin.

In practice, the method of the present invention can be used to prepare complex, three-dimensional objects by exposure of a photoreactive composition to a light source of sufficient energy to cause a photoreactive composition to react (e.g., react). Preferably, unreacted material is separated from the desired object by, e.g., washing with a solvent or other art-known means.

Figure 1A:
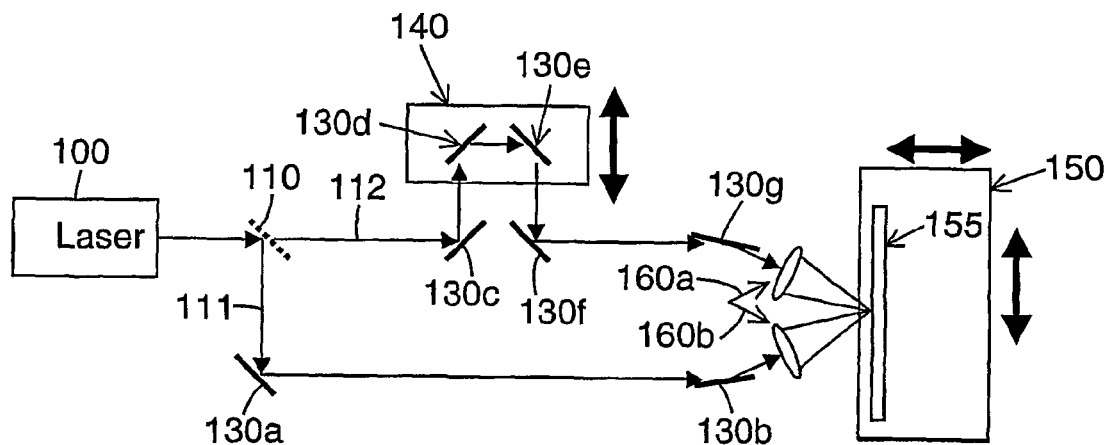
FIG. 1a illustrates a multidirectional reacting approach wherein 2 beams are incident from the same side of the photoreactive reactive composition.
Figure 1B:
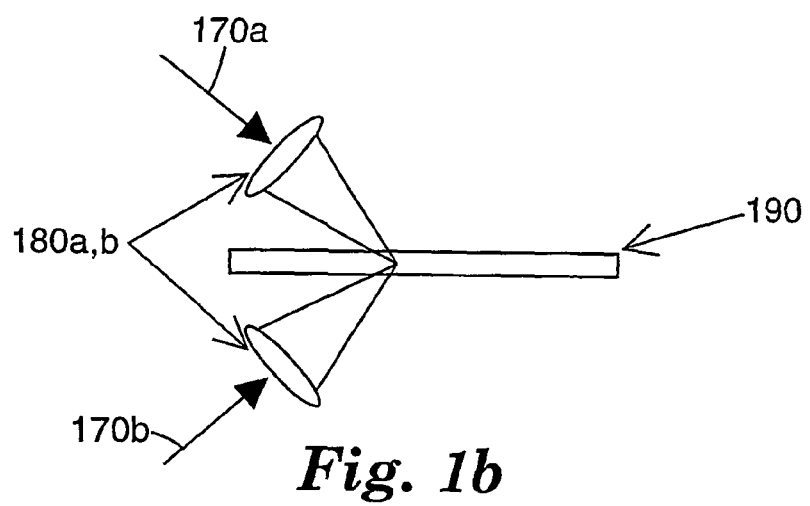
FIG. 1b illustrates a photoreactive composition placed between the focusing lenses so that light beams are incident upon the reacting region from opposite sides of the substrate.

A general diagram of a particular embodiment of this multidirectional reacting approach is shown in FIG. 1a. Light beam 110 from laser 100 is split into two beams 111 and 112 by beamsplitter 120. Beams 111 and 112 are reflected by mirrors 130a and 130b and 130c, d, e, f, and g, respectively, before being focused by lenses 160b and 160a, respectively, to the same volume element within the photoreactive composition 155. Mirrors 130d and 130e are mounted on translation stage 140 which can be moved to match the pathlengths of the two beams to allow the overlap of the short pulses within the desired reacting volumetric region. The photoreactive composition 155 is mounted onto translation stage 150 so the desired 3-dimensional pattern can be formed within the composition. FIG. 1b illustrates the situation where incident beams 170a and 170b (focused by lenses 180a and 180b, respectively) are used to react the same volumetric region within photoreactive composition 190, but are incident from opposite sides of the composition.

Using beams from multiple directions allows greater control over the shape and position of the reacted region or voxel. A voxel is a three-dimensional pixel or volume element, usually the smallest definable volume with a size and shape. When crossing the beams at other than 180 degrees (i.e., substantially non-counter propagating beams), the shape of the reacted voxel can be defined by the crossing region as well as the pulse timing and focal spot position and shape. By moving one of the optical components, the shape and size of the beam can be varied very quickly. Moving an optical component is much easier than changing the pulse length of the laser and can be easier than changing the optical delay time. A further advantage of the invention is that it allows use of lower numerical aperture (NA) optics. Lower NA optics are usually easier to use, have greater working distances (so deeper structures can be made), and are cheaper.

Another advantage of the invention is that using more than two beams from non-overlapping directions also increases the contrast of the exposure system. That is, the difference between each individual beam intensity (which cannot have enough intensity to react the material by itself to stay within the spirit of this invention) and the intensity total of all the beams is much greater.

It is a further advantage of the invention that having multiple beams transit the substantially different volume regions of the material has the potential to increase exposure speed without exceeding the ablation threshold of the material. When in a counter propagating arrangement, the position of the reacted region of a material is defined by the relative timing of the two pulses and the size and position of the two focal spots of the lenses. When using low NA lenses, the voxel cannot be made smaller than about half the length of the peak intensity region of the light pulse. This arrangement does nothing to lower the damage threshold in thermally insulating materials (including polymers, polymer precursors and dyes) less than about 10 mm thick and does very little for damage threshold for insulating materials less than 100 mm thick. Using multiple, non-counter propagating beams increases the surface area over which the light is introduced to the sample.

Almost any orientation of the beams can prove useful. Of note are mutually orthogonal beams which can form blocks, symmetrically distributed beams which can form approximate spheres, and nearly counter propagating beams, which can form lines. Using low NA lenses and four beams in a regular tetrahedral arrangement, one can make a large, approximately symmetrical voxel. Using more beams symmetrically arranged would increase the symmetry. The shape of the voxel can then be varied somewhat just by changing the combination of beams used to react the material and adjusting the power levels as necessary to compensate for the missing beams.

The reacting material is usually coated on a planar backing. All the beams can come from one side of the plane. This is necessary if any part of the substrate or support is opaque. The beams can come from opposite sides of the material plane if the substrate and all supports are transparent.

The relative polarization of the two beams may be set depending on whether or not optical interference is desired.

This multidirectional reacting approach can be extended to more than two beams lying within the same plane or in different planes. The angle between the beams incident upon the photoreactive composition can be changed to alter the overlap cross-section and thus to control the shape of the reacted region. Overlapping beams also provide additional control over the size and shape of the volume at peak power since the region of overlap of two beams depends on the pulse duration and the angle between the beams. This can result in additional z-axis resolution for the process without the constraint imposed by the smaller working distances characteristic of high numerical aperture lenses.

A different embodiment of this multidirectional approach (shown in FIG. 2) employs diffractive and micro-optical elements. The diffractive element 210 (a linear grating in this case) splits the incoming beam 200 into several beams 220*a*-220*e* propagating in different directions. Each of these beams passes through a transparent adjustable optical delay element 230*a*-230*e* consisting of an electro-optical material (such as $LiNbO_3$). Altering the voltage applied across this material changes the material refractive index (which in turn changes the effective optical path length). After each beam passes through its individual optical delay element, the beams are incident upon a refractive microlens array 240. The aspheric off-axis lenses in this array steer and focus the incident beams to the same volumetric region 260 within the photoreactive material 250. Introduction of appropriate delay into each beam path allows the overlap of all pulses at the desired location in space and time.

Figure 2:
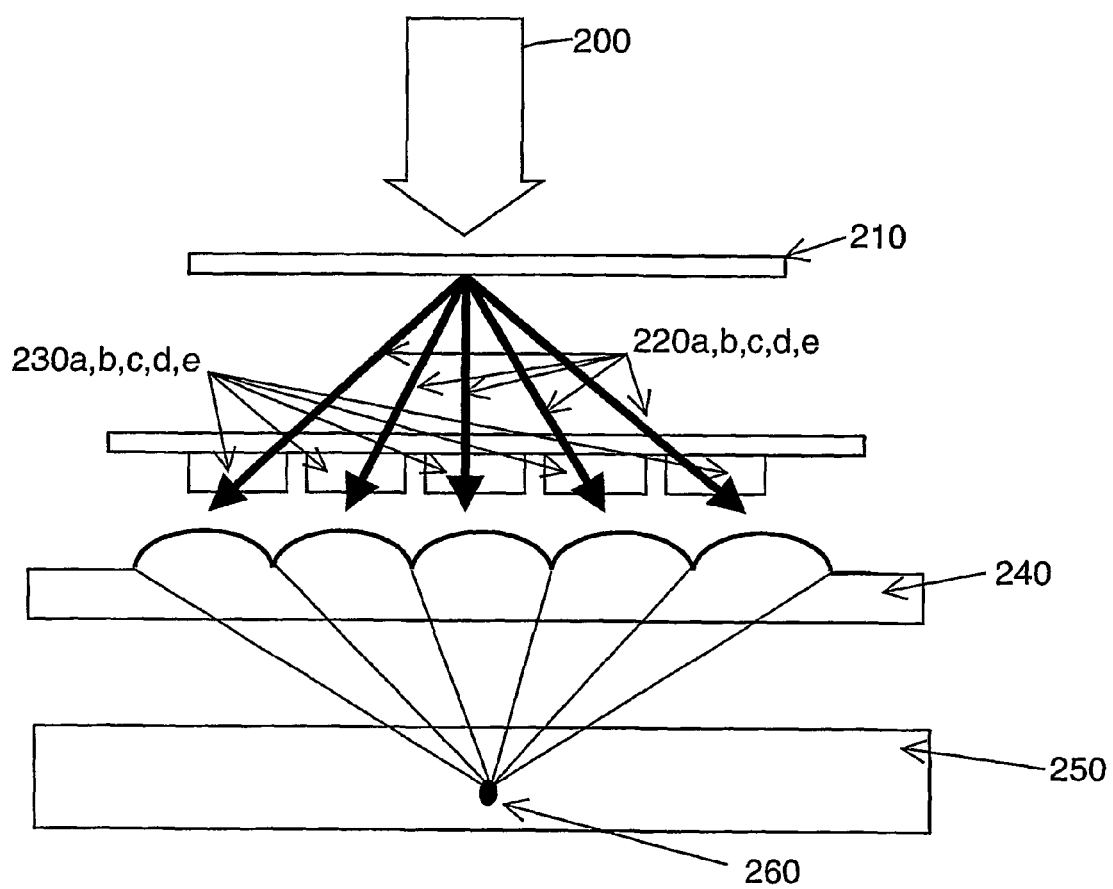
FIG. 2 illustrates a multidirectional reacting approach employing diffractive and mico-optical elements extended to more than two beams lying within the same plane or in different planes. The angle between the beams incident upon the photoreactive composition can be changed to alter the overlap cross-section and thus to control the shape of the reacted region.

Several variations of the embodiment shown in FIG. 2 can be used to produce similar results. A more general diffractive optical element may be used to separate the incident beam into a two-dimensional array of beams instead of using a linear diffraction grating to create a one-dimensional fan of beams. The final focusing/steering refractive microlens array shown in FIG. 2 may be replaced with a diffractive optical element performing the same function. A large portion of the system may be constructed as an integrated optical device in which the beam-splitting grating and optical delay elements are constructed using waveguides on a planar substrate (the conventional way $LiNbO_3$ devices are constructed). The electro-optic refractive index control described above may be replaced in an integrated optical system by a fixed optical delay element. However, fine adjustment of the length of each optical path is necessary to compensate for system construction errors in a practical system; therefore, the tunable system embodiment shown in FIG. 2 is preferred to a fixed system.

The shape and orientation angle of the volume element within the photoreactive composition that is illuminated by the refractive optical elements can be controlled by appropriate design of the focusing elements (such as by incorporating off-axis, aspheric, and anamorphic surfaces).

The embodiments of multidirectional exposure described above assume that each of the light beams incident upon the same volume element within the photoreactive composition originate from the same laser source. An alternate method of enhancing peak power in the volume of interest is to direct laser beams from multiple laser sources at the same volume element from different directions.

In addition to controlling the size and shape of the voxel through the use of multiple beams that overlap within the reacting region, it is also possible to control the location of the voxel through the appropriate choice of the relative delay between the beams. As discussed in the background material, WO 99/54784 describes the use of two counter propagating beams for enhanced z-axis resolution; the exact vertical location of reacting is determined by the relative delay between the two pulses (which is controlled by a mechanical stage which moves several mirrors within one beam path). In the present invention, the relative delay between multiple non-counter propagating beams is used in conjunction with active focal length control (of the focusing lenses) to determine the location of the reacted voxel within a multiphoton reactive composition (which may be stationary or moving).

One embodiment of this method can be described by considering the apparatus shown in FIG. 2. Placement of a set of optical delay elements between the refractive microlens array 240 and the multiphoton-reactive (i.e., photoreactive) composition 250 (in addition to the optical delay elements 230a-230e shown in FIG. 2) allows the simultaneous control of the relative delay between each pulse and the location of the focal point of each beam within the photoreactive composition 250. As before, the optical delay elements 230a-230e provide the optical delay necessary to control the relative timing of each pulse so they overlap within the desired voxel. The additional set of optical delay elements placed into the beams as they are focused changes the focal point of each lens. Therefore, the use of electro-optical delay elements (such as $LiNbO_3$) allows the synchronization of the change in focal position with the change in pulse delay. Thus, the reacted voxel can be moved vertically (and horizontally to a lesser degree) without requiring translation of the photoreactive composition. The invention is not limited to static lenses used in conjunction with electrically-addressable planar optical delay elements to yield adjustable focal lengths; any devices capable of active focal length control are understood to be included in the spirit of the present invention.

The synchronized combination of active control over the shape of the reacted voxel (by turning multiple beams on and off and changing the relative delay between beams) and the location of the reacted voxel (by adjustment of the focal lengths of the lenses and the relative delay between beams) allows increased throughput compared to a system in which voxel movement only results from translation of the photoreactive composition.

Photoreactive compositions useful in the present invention include at least one reactive species, at least one photoreactive photosensitizer, optionally at least one electron donor compound, and optionally at least one photoinitiator for the photoreactive composition.

Reactive Species

Reactive species suitable for use in the photoreactive compositions include both photoreactive and non-photoreactive species. Photoreactive species are generally preferred and include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (including, for example, epoxies, vinyl ethers, cyanate esters, etc.), and the like, and mixtures thereof.

Suitable ethylenically-unsaturated species are described, for example, by Palazzotto et al. in U.S. Pat. No. 5,545,676 at column 1, line 65, through column 2, line 26, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethyl methane, trishydroxyethyl-isocyanurate trimethacrylate, the bis-acrylates and bis-methacrylates of polyethylene glycols of molecular weight about 200-500, copolymerizable mixtures of acrylated monomers such as those of U.S. Pat. No. 4,652,274, and acrylated oligomers such as those of U.S. Pat. No. 4,642,126); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and the like; and mixtures thereof. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as Sarbox™ resins available from Sartomer (for example, Sarbox™ 400, 401, 402, 404, and 405). Other useful reactive polymers photoreactive by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used if desired. Preferred ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic react at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099.

Other epoxy-containing materials that are useful include glycidyl ether monomers of the formula

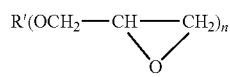

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations Epon™ 828, Epon™ 825, Epon™ 1004, and Epon™ 1010 from Resolution Performance Products, formerly Shell Chemical Co., as well as DER™-331, DER™-332, and DER™-334 from Dow Chemical Co.), vinylcyclohexene dioxide (for example, ERL-4206 from Union Carbide Corp.), 3,4-epoxycyclohexylmethyl-3,4-epoxycyclohexene carboxylate (for example, ERL-4221 or Cyracure™ UVR 6110 or UVR 6105 from Union Carbide Corp.), 3,4-epoxy-6-methylcyclohexylmethyl-3,4-epoxy-6-methylcyclohexene carboxylate (for example, ERL-4201 from Union Carbide Corp.), bis(3,4-epoxy-6-methylcyclohexylmethyl) adipate (for example, ERL-4289 from Union Carbide Corp.), bis(2,3-epoxycyclopentyl) ether (for example, ERL-0400 from Union Carbide Corp.), aliphatic epoxy modified from polypropylene glycol (for example, ERL-4050 and ERL-4052 from Union Carbide Corp.), dipentene dioxide (for example, ERL-4269 from Union Carbide Corp.), epoxidized polybutadiene (for example, Oxiron™ 2001 from FMC Corp.), silicone resin containing epoxy functionality, flame retardant epoxy resins (for example, DER™-580, a brominated bisphenol type epoxy resin available from Dow Chemical Co.), 1,4-butanediol diglycidyl ether of phenolformaldehyde novolak (for example, DEN™-431 and DEN™-438 from Dow Chemical Co.), resorcinol diglycidyl ether (for example, Kopoxite™ from Koppers Company, Inc.), bis(3,4-epoxycyclohexyl)adipate (for example, ERL-4299 or UVR-6128, from Union Carbide Corp.), 2-(3,4-epoxycyclohexyl-5,5-spiro-3,4-epoxy) cyclohexane-meta-dioxane (for example, ERL-4234 from Union Carbide Corp.), vinylcyclohexene monoxide 1,2-epoxyhexadecane (for example, UVR-6216 from Union Carbide Corp.), alkyl glycidyl ethers such as alkyl $C_8$-$C_{10}$ glycidyl ether (for example, Heloxy™ Modifier 7 from Resolution Performance Products), alkyl $C_{12}$-$C_{14}$ glycidyl ether (for example, Heloxy™ Modifier 8 from Resolution Performance Products), butyl glycidyl ether (for example, Heloxy™ Modifier 61 from Resolution Performance Products), cresyl glycidyl ether (for example, Heloxy™ Modifier 62 from Resolution Performance Products), p-tert-butylphenyl glycidyl ether (for example, Heloxy™ Modifier 65 from Resolution Performance Products), polyfunctional glycidyl ethers such as diglycidyl ether of 1,4-butanediol (for example, Heloxy™ Modifier 67 from Resolution Performance Products), diglycidyl ether of neopentyl glycol (for example, Heloxy™ Modifier 68 from Resolution Performance Products), diglycidyl ether of cyclohexanedimethanol (for example, Heloxy™ Modifier 107 from Resolution Performance Products), trimethylol ethane triglycidyl ether (for example, Heloxy™ Modifier 44 from Resolution Performance Products), trimethylol propane triglycidyl ether (for example, Heloxy™ Modifier 48 from Resolution Performance Products), polyglycidyl ether of an aliphatic polyol (for example, Heloxy™ Modifier 84 from Resolution Performance Products), polyglycol diepoxide (for example, Heloxy™ Modifier 32 from Resolution Performance Products), bisphenol F epoxides (for example, Epon™-1138 or GY-281 from Ciba-Geigy Corp.), and 9,9-bis[4-(2,3-epoxypropoxy)-phenyl]fluorenone (for example, Epon™ 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717 (Eckberg), which are commercially available from the General Electric Company. These are polydimethylsiloxanes in which 1-20 mole % of the silicon atoms have been substituted with epoxyalkyl groups (preferably, epoxy cyclohexylethyl, as described in U.S. Pat. No. 5,753,346 (Kessel)).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (such as the Epon™ resins available from Resolution Performance Products) and cycloaliphatic epoxies (such as ERL-4221 and ERL-4299 available from Union Carbide).

Suitable cationally-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (Rapi-Cure™ DVE-3, available from International Specialty Products, Wayne, N.J.), trimethylolpropane trivinyl ether (TMPTVE, available from BASF Corp., Mount Olive, N.J.), and the Vectomer™ divinyl ether resins from Allied Signal (for example, Vectomer™ 2010, Vectomer™ 2020, Vectomer™ 4010, and Vectomer™ 4020 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

Non-photoreactive species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-photoreactive species also include the chemically-amplified photoresists described by R. D. Allen, G. M. Wallraff, W. D. Hinsberg, and L. L. Simpson in "High Performance Acrylic Polymers for Chemically Amplified Photoresist Applications," *J. Vac. Sci. Technol. B*, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in *Proc. SPIE*, 2438, 474 (1995), and the like); depolymerization (for example, polyphthalaldehyde-based materials); and rearrangement (for example, materials based on the pinacol rearrangements).

Useful non-photoreactive species also include leuco dyes, which tend to be colorless until they are oxidized by acid generated by the photoreactive photoinitiator system, and which, once oxidized, exhibit a visible color. (Oxidized dyes are colored by virtue of their absorbance of light in the visible portion of the electromagnetic spectrum (approximately 400-700 nm).) Leuco dyes useful in the present invention are those that are reactive or oxidizable under moderate oxidizing conditions and yet that are not so reactive as to oxidize under common environmental conditions. There are many such chemical classes of leuco dyes known to the imaging chemist.

Leuco dyes useful as reactive species in the present invention include acrylated leuco azine, phenoxazine, and phenothiazine, which can, in part, be represented by the structural formula:

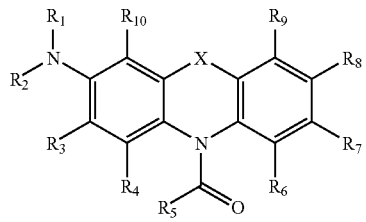

wherein X is selected from O, S, and —N—$R^{11}$, with S being preferred; $R^1$ and $R^2$ are independently selected from H and alkyl groups of 1 to about 4 carbon atoms; $R^3$, $R^4$, $R^6$, and $R^7$ are independently selected from H and alkyl groups of 1 to about 4 carbon atoms, preferably methyl; $R^5$ is selected from alkyl groups of 1 to about 16 carbon atoms, alkoxy groups of 1 to about 16 carbon atoms, and aryl groups of up to about 16 carbon atoms; $R^8$ is selected from —$N(R^1)(R^2)$, H, alkyl groups of 1 to about 4 carbon atoms, wherein $R^1$ and $R^2$ are independently selected and defined as above; $R^9$ and $R^{10}$ are independently selected from H and alkyl groups of 1 to about 4 carbon atoms; and $R^{11}$ is selected from alkyl groups of 1 to about 4 carbon atoms and aryl groups of up to about 11 carbon atoms (preferably, phenyl groups). The following compounds are examples of this type of leuco dye:

Copichem II

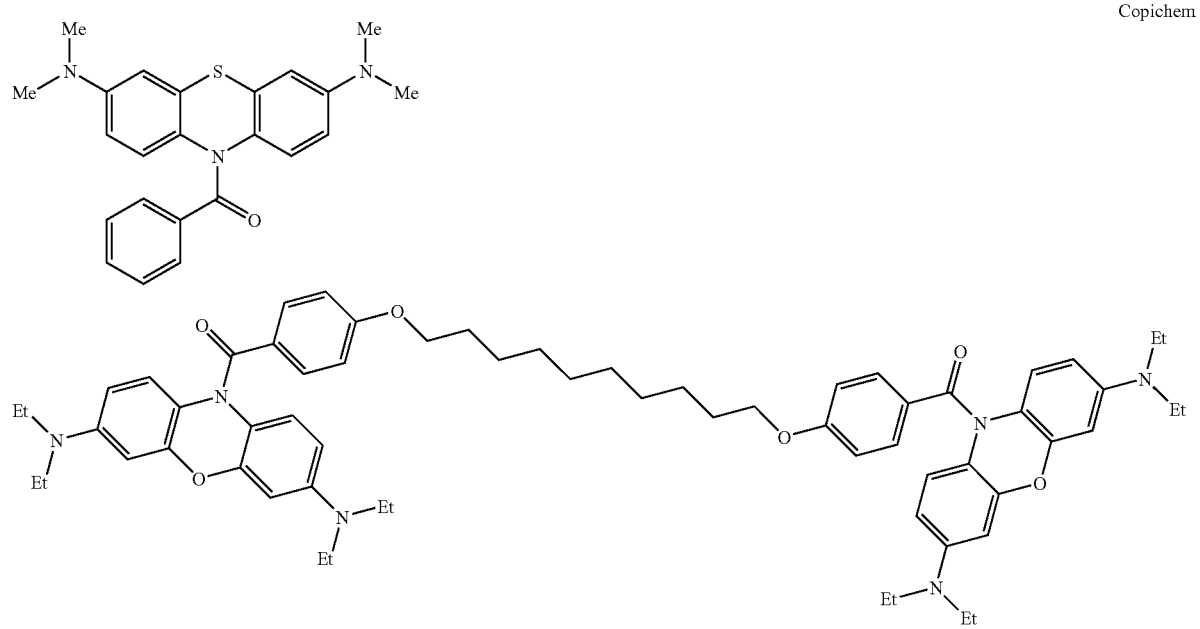

Other useful leuco dyes include, but are not limited to, Leuco Crystal Violet (4,4',4''-methylidynetris-(N,N-dimethylaniline)), Leuco Malachite Green (p,p'-benzylidenebis-(N,N-dimethylaniline)), Leuco Atacryl Orange-LGM (Color Index Basic Orange 21, Comp. No. 48035 (a Fischer's base type compound)) having the structure

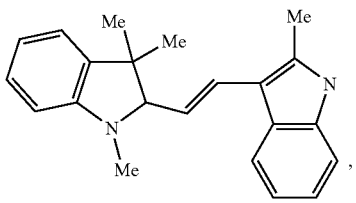

Leuco Atacryl Brilliant Red-4G (Color Index Basic Red 14) having the structure

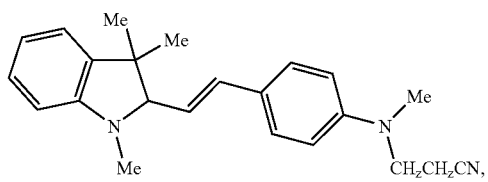

Leuco Atacryl Yellow-R (Color Index Basic Yellow 11, Comp. No. 48055) having the structure

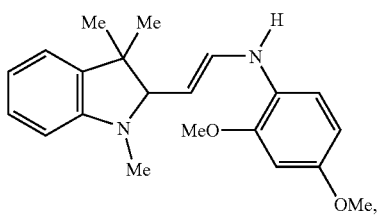

Leuco Ethyl Violet (4,4',4"-methylidynetris-(N,N-diethylaniline), Leuco Victoria Blu-BGO (Color Index Basic Blue 728a, Comp. No. 44040; 4,4'-methylidynebis-(N,N,-dimethylaniline)-4-N-ethyl-1-napthalamine)), and LeucoAtlantic Fuchsine Crude (4,4',4"-methylidynetris-aniline).

The leuco dye(s) can generally be present at levels of at least about 0.01% by weight of the total weight of a light sensitive layer (preferably, at least about 0.3% by weight; more preferably, at least about 1% by weight; most preferably, at least about 2% to 10% or more by weight). Other materials such as binders, plasticizers, stabilizers, surfactants, antistatic agents, coating aids, lubricants, fillers, and the like can also be present in the light sensitive layer. One of skill in the art can readily determine the desirable amount of additives. For example, the amount of filler is chosen such that there is no undesirable scatter at the writing wavelength.

If desired, mixtures of different types of reactive species can be utilized in the photoreactive compositions. For example, mixtures of free-radically-reactive species and cationically-reactive species, mixtures of photoreactive species and non-photoreactive species, and so forth, are also useful.

Photoinitiator System (1) Photoreactive Photosensitizers

Photoreactive photosensitizers suitable for use in the photoreactive photoinitiator system of the photoreactive compositions are those that are capable of simultaneously absorbing at least two photons when exposed to sufficient light. Preferably, they have a two-photon absorption cross-section greater than that of fluorescein (that is, greater than that of 3',6'-dihydroxyspiro[isobenzofuran-1(3H),9'-[9H]xanthen]3-one). Generally, the cross-section can be greater than about $50 \times 10^{-50}$ cm$^4$ sec/photon, as measured by the method described by C. Xu and W. W. Webb in *J. Opt. Soc. Am. B*, 13, 481 (1996) (which is referenced by Marder and Perry et al. in International Publication No. WO 98/21521 at page 85, lines 18-22).

This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well-known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by I. B. Berlman in *Handbook of Fluorescence Spectra of Aromatic Molecules*, Second Edition, pages 24-27, Academic Press, New York (1971); by J. N. Demas and G. A. Crosby in *J. Phys. Chem.*, 75, 991-1024 (1971); and by J. V. Morris, M. A. Mahoney, and J. R. Huber in *J. Phys. Chem.*, 80, 969-974 (1976).

Assuming that the emitting state is the same under one- and two-photon excitation (a common assumption), the two-photon absorption cross-section of the photosensitizer, ($\delta_{sam}$) is equal to $\delta_{ref} K (I_{sam}/I_{ref})(\phi_{sam}/\phi_{ref})$, wherein $\delta_{ref}$ is the two-photon absorption cross-section of the reference compound, $I_{sam}$ is the fluorescence intensity of the photosensitizer, $I_{ref}$ is the fluorescence intensity of the reference compound $\phi_{sam}$ is the fluorescence quantum efficiency of the photosensitizer, $\phi_{ref}$ is the fluorescence quantum efficiency of the reference compound, and K is a correction factor to account for slight differences in the optical path and response of the two detectors. K can be determined by measuring the response with the same photosensitizer in both the sample and reference arms. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregration effects).

When the photosensitizer is not fluorescent, the yield of electronic excited states can to be measured and compared with a known standard. In addition to the above-described method of determining fluorescence yield, various methods of measuring excited state yield are known (including, for example, transient absorbance, phosphorescence yield, photoproduct formation or disappearance of photosensitizer (from photoreaction), and the like).

Preferably, the two-photon absorption cross-section of the photosensitizer is greater than about 1.5 times that of fluorescein (or, alternatively, greater than about $75\times10^{-50}$ cm$^4$ sec/photon, as measured by the above method); more preferably, greater than about twice that of fluorescein (or, alternatively, greater than about $100\times10^{-50}$ cm$^4$ sec/photon); most preferably, greater than about three times that of fluorescein (or, alternatively, greater than about $150\times10^{-50}$ cm$^4$ sec/photon); and optimally, greater than about four times that of fluorescein (or, alternatively, greater than about $200\times10^{-50}$ cm$^4$ sec/photon).

Preferably, the photosensitizer is soluble in the reactive species (if the reactive species is liquid) or is compatible with the reactive species and with any binders (as described below) that are included in the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000-55,000 molecular weight, 9.0-13.0% hydroxyl content polyvinyl butyral (Butvar™ B76, Monsanto); 0.3 parts trimethylolpropane trimethacrylate; and 0.03 parts 2-methyl-4,6-bis(trichloromethyl)-s-triazine (see Bull. Chem. Soc. Japan, 42, 2924-2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover mm can be carefullly placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Particularly preferred photoreactive photosensitizers include those exhibiting large photoreactive absorption cross-sections, such as Rhodamine B (that is, N-[9-(2-carboxyphenyl)-6-(diethylamino)-3H-xanthen-3-ylidene]-N-ethylethanaminium chloride, and the hexafluoroantimonate salt of Rhodamine B) and the four classes of photosensitizers described, for example, by Marder and Perry et al. in International Patent Publication Nos. WO 98/21521 and WO 99/53242. The four classes can be described as follows: (a) molecules in which two donors are connected to a conjugated π (pi)-electron bridge; (b) molecules in which two donors are connected to a conjugated π (pi)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge).

Representative examples of such photosensitizers include:

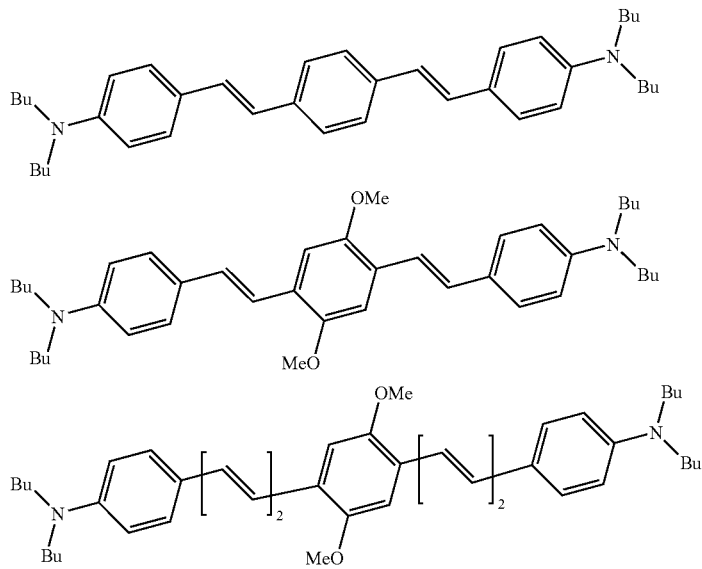

-continued
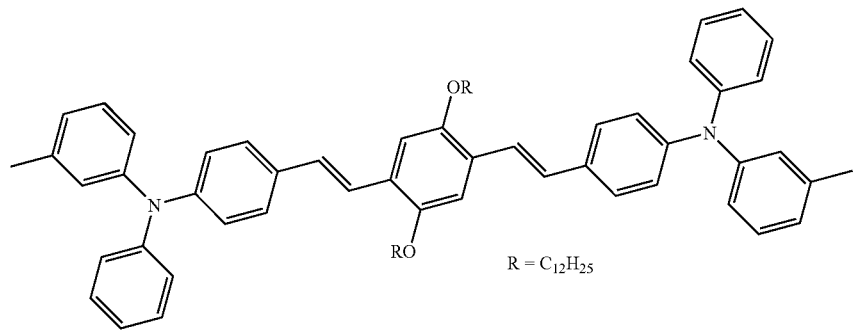
R = C₁₂H₂₅
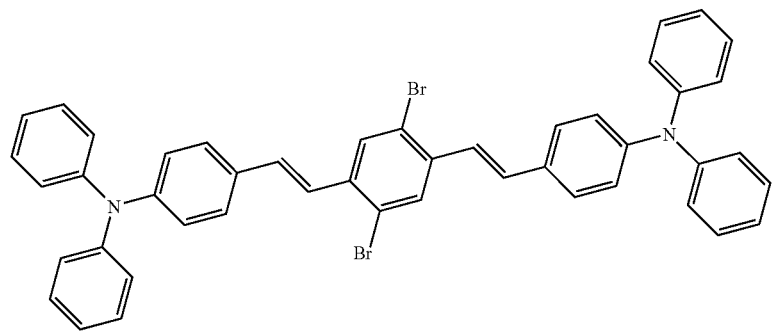
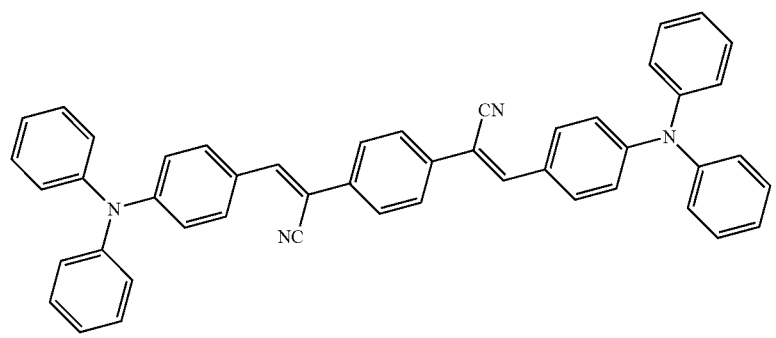
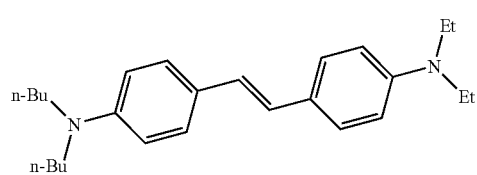
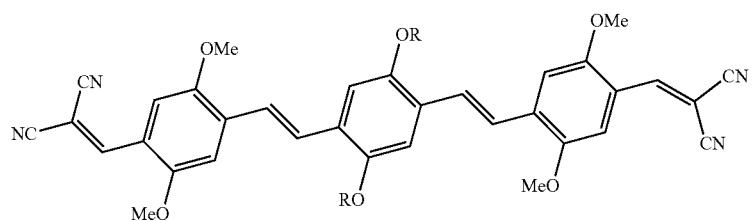
R = C₁₂H₂₅
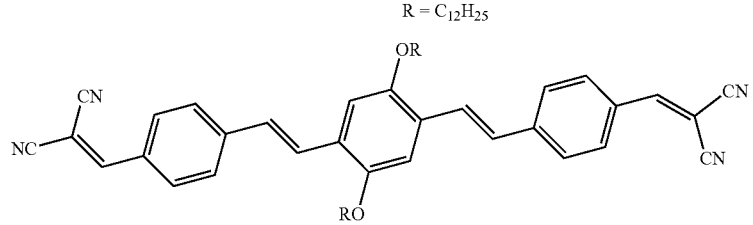
R = C₁₂H₂₅

-continued
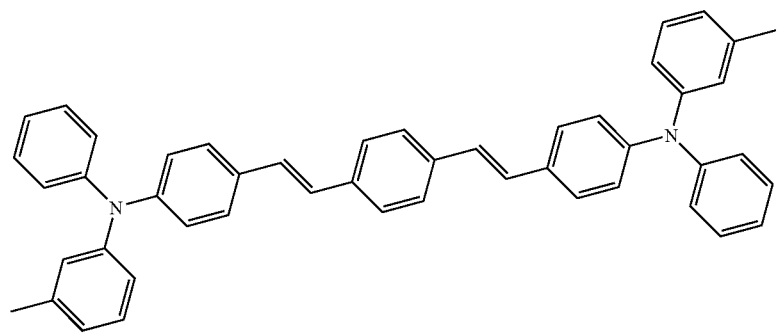
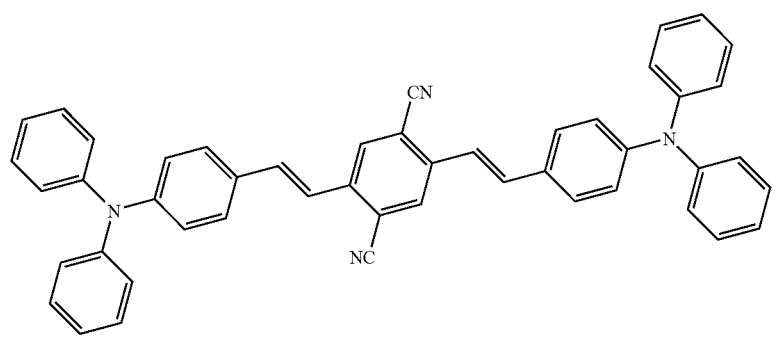
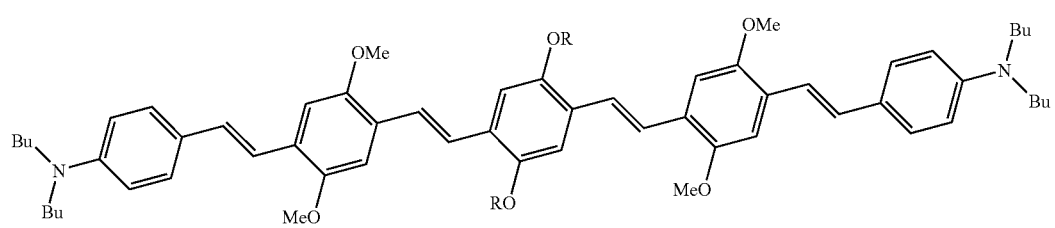
R = C₁₂H₂₅
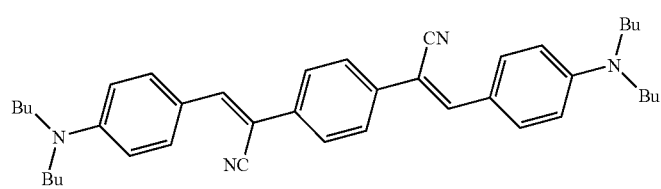
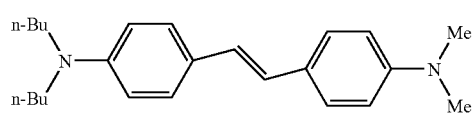
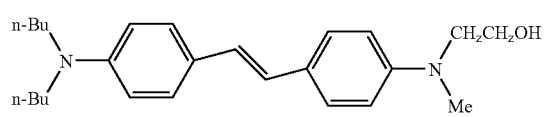
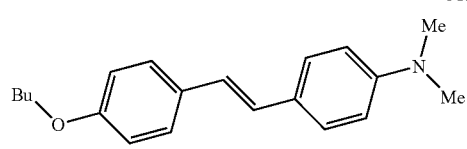
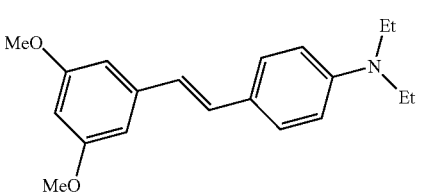
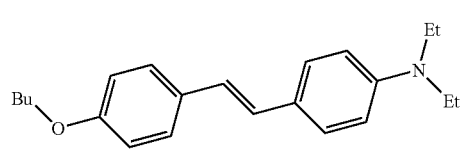
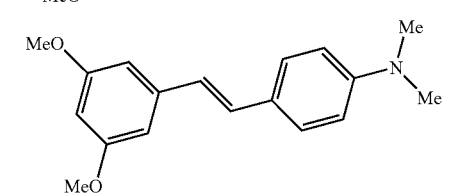

-continued
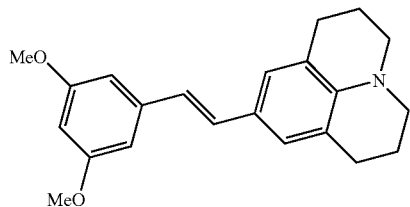
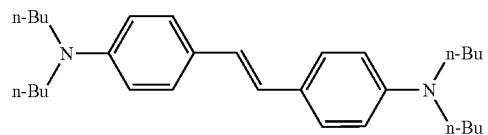
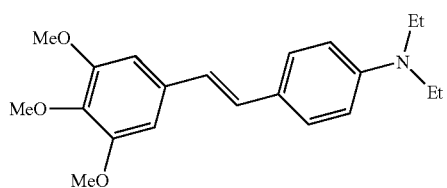
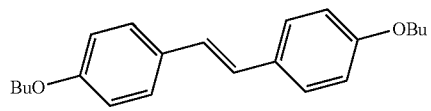
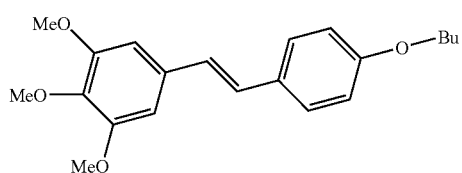
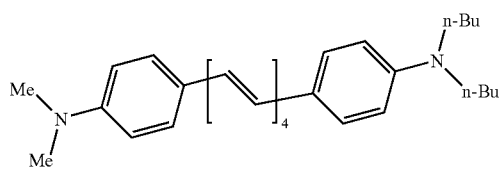
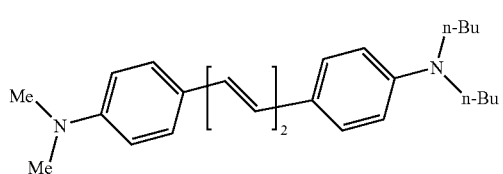
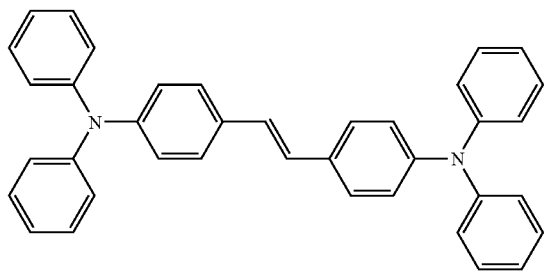
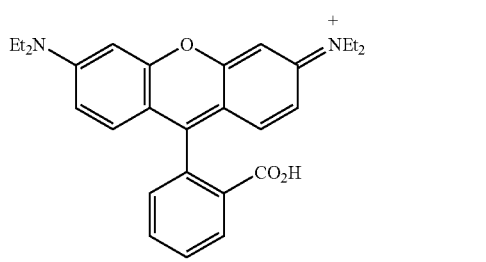
X⁻ where X⁻ = Cl⁻, PF₆⁻, SbF₆⁻, AsF₆⁻, BF₄⁻, CF₃SO₃⁻
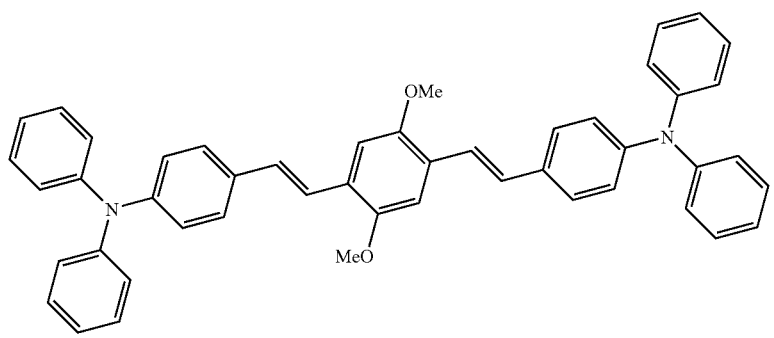

The four above-described classes of photosensitizers can be prepared by reacting aldehydes with ylides under standard Wittig conditions or by using the McMurray reaction, as detailed in International Patent Publication No. WO 98/21521.

Other compounds are described by Reinhardt et al. (for example, in U.S. Pat. Nos. 6,100,405, 5,859,251, and 5,770,737) as having large photoreactive absorption cross-sections, although these cross-sections were determined by a method other than that described above. Representative examples of such compounds include:

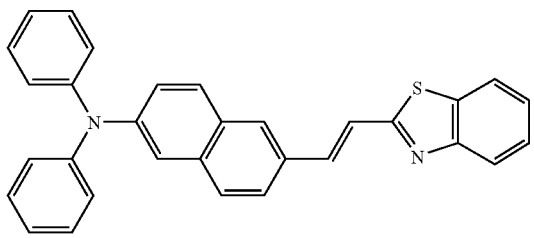

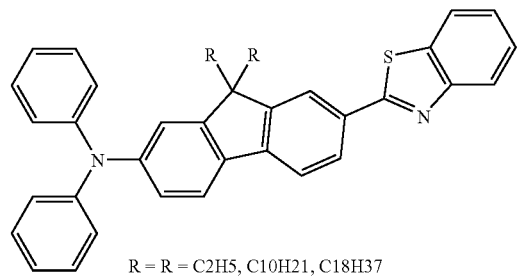

R = R = C2H5, C10H21, C18H37

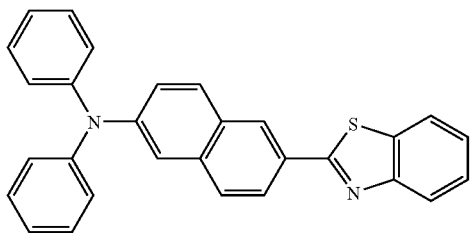

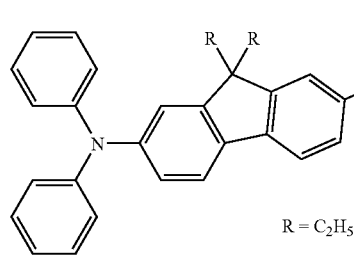

R = $C_2H_5$

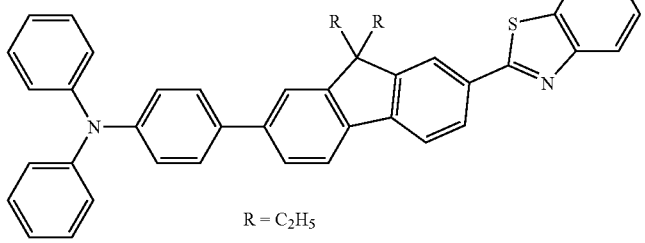

R = $C_2H_5$

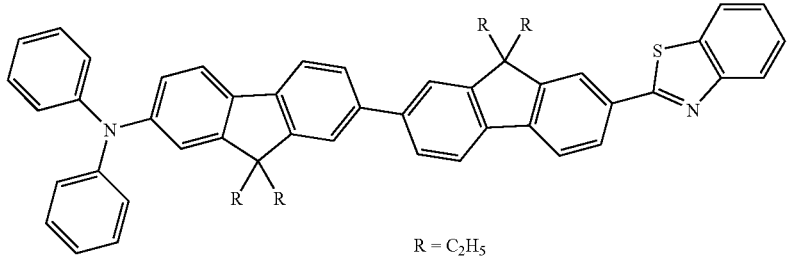

R = $C_2H_5$

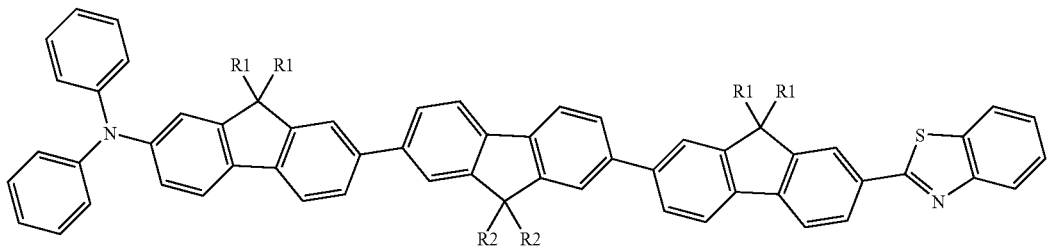

R1 = $C_2H_5$
R2 = $C_{10}H_{21}$

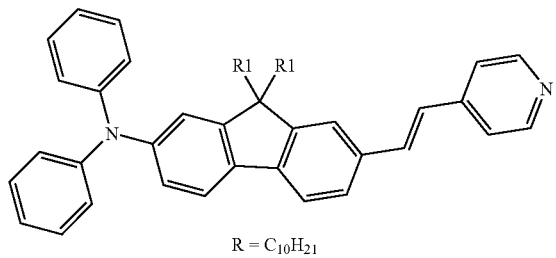

R = C₁₀H₂₁

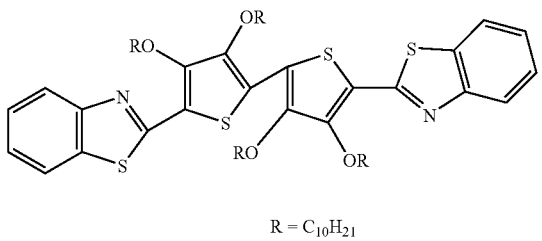

R = C₁₀H₂₁

Other compounds which may be useful as photosensitizers in the present invention include but are not limited to fluorescein, p-bis(o-methylstyryl)benzene, eosin, rose Bengal, erythrosin, Coumarin 307 (Eastman Kodak), Cascade Blue hydrazide trisodium salt, Lucifer Yellow CH ammonium salt, 4,4-difluoro-1,3,5,7,8-pentamethyl-4-bora-3α,4α-diazain-dacene-2,6-disulfonic acid disodium salt, 1,1-dioctadecyl-3, 3,3',3'-tetramethylindocarbocyanine perchlorate, Indo-1 pentapotassium salt (Molecular Probes), 5-dimethylaminonaphthalene-1-sulfonyl hydrazine, 4',6-diamidino-2-phenylindole dihydrochloride, 5,7-diiodo-3-butoxy-6-fluorone, 9-fluorenone-2-carboxylic acid, and compounds having the following structures:

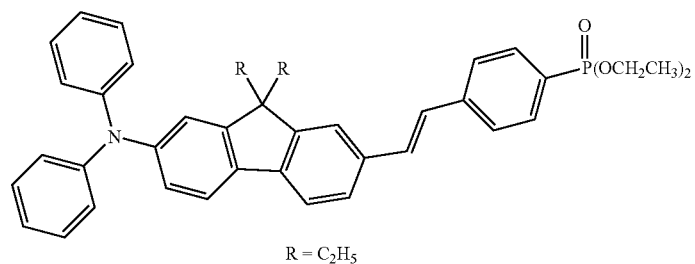

R = C₂H₅

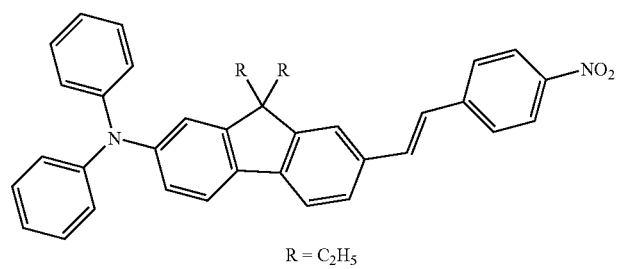

R = C₂H₅

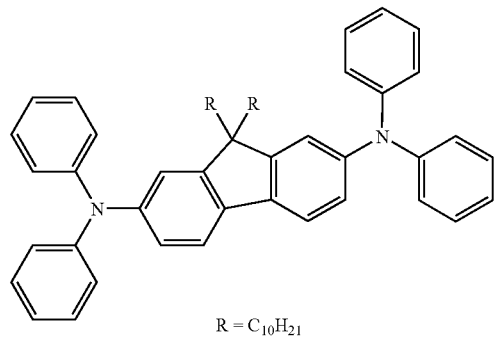

R = C₁₀H₂₁

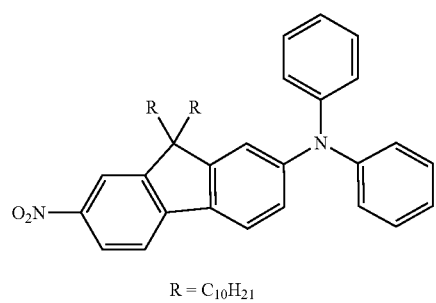

R = C₁₀H₂₁

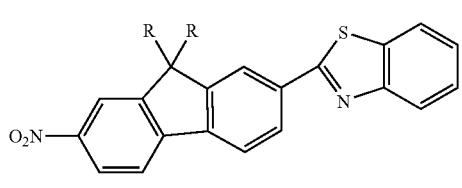

R = C₁₀H₂₁

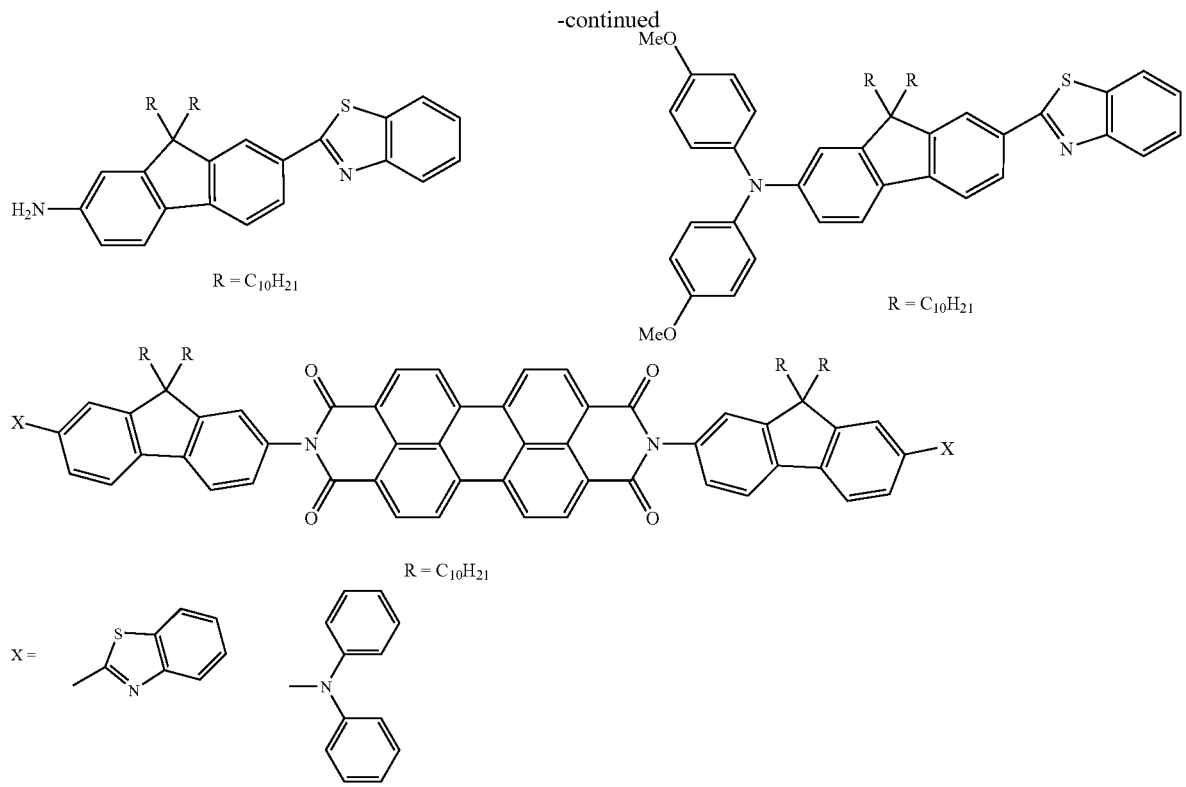

(2) Electron Donor Compounds

Electron donor compounds useful in the photoreactive photoinitiator system of the photoreactive compositions are those compounds (other than the photosensitizer itself) that are capable of donating an electron to an electronic excited state of the photosensitizer. The electron donor compounds preferably have an oxidation potential that is greater than zero and less than or equal to that of p-dimethoxybenzene vs. a standard saturated calomel electrode. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of reaction (e.g., react) or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406 (Oxman et al.) at column 7, line 62, through column 8, line 49.)

In general, electron donor compounds suitable for use with particular photosensitizers and photoinitiators can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Nonaqueous Systems* (1970). The potentials reflect relative energy relationships and can be used in the following manner to guide electron donor compound selection.

When the photosensitizer is in an electronic excited state, an electron in the highest occupied molecular orbital (HOMO) of the photosensitizer has been lifted to a higher energy level (namely, the lowest unoccupied molecular orbital (LUMO) of the photosensitizer), and a vacancy is left behind in the molecular orbital it initially occupied. The photoinitiator can accept the electron from the higher energy orbital, and the electron donor compound can donate an electron to fill the vacancy in the originally occupied orbital, provided that certain relative energy relationships are satisfied.

If the reduction potential of the photoinitiator is less negative (or more positive) than that of the photosensitizer, an electron in the higher energy orbital of the photosensitizer is readily transferred from the photosensitizer to the lowest unoccupied molecular orbital (LUMO) of the photoinitiator, since this represents an exothermic process. Even if the process is instead slightly endothermic (that is, even if the reduction potential of the photosensitizer is up to 0.1 volt more negative than that of the photoinitiator) ambient thermal activation can readily overcome such a small barrier.

In an analogous manner, if the oxidation potential of the electron donor compound is less positive (or more negative) than that of the photosensitizer, an electron moving from the HOMO of the electron donor compound to the orbital vacancy in the photosensitizer is moving from a higher to a lower potential, which again represents an exothermic process. Even if the process is slightly endothermic (that is, even if the oxidation potential of the photosensitizer is up to 0.1 volt more positive than that of the electron donor compound), ambient thermal activation can readily overcome such a small barrier.

Slightly endothermic reactions in which the reduction potential of the photosensitizer is up to 0.1 volt more negative than that of the photoinitiator, or the oxidation potential of the photosensitizer is up to 0.1 volt more positive than that of the electron donor compound, occur in every instance, regardless of whether the photoinitiator or the electron donor compound first reacts with the photosensitizer in its excited state. When the photoinitiator or the electron donor compound is reacting with the photosensitizer in its excited state, it is preferred that the reaction be exothermic or only slightly endothermic. When the photoinitiator or the electron donor compound is reacting with the photosensitizer ion radical, exothermic reactions are still preferred, but still more endothermic reactions can be expected in many instances to occur. Thus, the reduction potential of the photosensitizer can be up to 0.2 volt (or more) more negative than that of a second-to-react photoinitiator, or the oxidation potential of the photosensitizer can be up to 0.2 volt (or more) more positive than that of a second-to-react electron donor compound.

Suitable electron donor compounds include, for example, those described by D. F. Eaton in *Advances in Photochemistry*, edited by B. Voman et al., Volume 13, pp. 427-488, John Wiley and Sons, New York (1986); by Oxman et al. in U.S. Pat. No. 6,025,406 at column 7, lines 42-61; and by Palazzotto et al. in U.S. Pat. No. 5,545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$ borates (n+m=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as $n-C_3H_7Sn(CH_3)_3$, $(allyl)Sn(CH_3)_3$, and $(benzyl)Sn(n-C_3H_7)_3$), ferrocene, and the like, and mixtures thereof The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethylaminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis (dimethylamino)diphenylsilane, tris(dimethylamino) methylsilane, N,N-diethylaminotrimethylsilane, tris (dimethylamino)phenylsilane, tris(methylsilyl)amine, tris (dimethylsilyl)amine, bis(dimethylsilyl)amine, N,N-bis (dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include $Ar_3B^-(n-C_4H_9)N^+(C_2H_5)_4$
$Ar_3B^-(n-C_4H_9)N^+(CH_3)_4$
$Ar_3B^-(n-C_4H_9)N^+(n-C_4H_9)_4$
$Ar_3B^-(n-C_4H_9)Li^+$
$Ar_3B^-(n-C_4H_9)N^+(C_6H_{13})_4$
$Ar_3B^-—(C_4H_9)N^+(CH_3)_3(CH_2)_2CO_2(CH_2)_2CH_3$
$Ar_3B^-—(C_4H_9)N^+(CH_3)_3(CH_2)_2OCO(CH_2)_2CH_3$
$Ar_3B^-(sec-C_4H_9)N^+(CH_3)_3(CH_2)_2CO_2(CH_2)_2CH_3$
$Ar_3B^-(sec-C_4H_9)N^+(C_6H_{13})_4$
$Ar_3B^-—(C_4H_9)N^+(C_8H_{17})_4$
$Ar_3B^-—(C_4H_9)N^+(CH_3)_4$
$(p-CH_3O—C_6H_4)_3B^-(n-C_4H_9)N^+(n-C_4H_9)_4$
$Ar_3B^-—(C_4H_9)N^+(CH_3)_3(CH_2)_2OH$
$ArB^-(n-C_4H_9)_3N^+(CH_3)_4$
$ArB^-(C_2H_5)_3N^+(CH_3)_4$
$Ar_2B^-(n-C_4H_9)_2N^+(CH_3)_4$
$Ar_3B^-(C_4H_9)N^+(C_4H_9)_4$
$Ar_4B^-N^+(C_4H_9)_4$
$ArB^-(CH_3)_3N^+(CH_3)_4$
$(n-C_4H_9)_4B^-N^+(CH_3)_4$
$Ar_3B^-(C_4H_9)P^+(C_4H_9)_4$ (where Ar is phenyl, naphthyl, substituted (preferably, fluoro-substituted) phenyl, substituted naphthyl, and like groups having greater numbers of fused aromatic rings), as well as tetramethylammonium n-butyltriphenylborate and tetrabutylammonium n-hexyl-tris(3-fluorophenyl)borate (available as CGI 437 and CGI 746 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

(3) Photoinitiators

Suitable photoinitiators for the reactive species of the photoreactive compositions are those that are capable of being photosensitized by accepting an electron from an electronic excited state of the photoreactive photosensitizer, resulting in the formation of at least one free radical and/or acid. Such photoinitiators include iodonium salts (for example, diaryliodonium salts), chloromethylated triazines (for example, 2-methyl-4,6-bis(trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

The photoinitiator is preferably soluble in the reactive species and is preferably shelf-stable (that is, does not spontaneously promote reaction of the reactive species when dissolved therein in the presence of the photosensitizer and the electron donor compound). Accordingly, selection of a particular photoinitiator can depend to some extent upon the particular reactive species, photosensitizer, and electron donor compound chosen, as described above. Preferred photoinitiators are those that exhibit large photoreactive adsorption cross-sections, as described, e.g., by Marder, Perry et al., in PCT Patent Applications WO 98/21521 and WO 995/3242, and by Goodman et al., in PCT Patent Application WO 99/54784.

Suitable iodonium salts include those described by Palazzotto et al. in U.S. Pat. No. 5,545,676 at column 2, lines 28 through 46. Suitable iodonium salts are also described in U.S. Pat. Nos. 3,729,313, 3,741,769, 3,808,006, 4,250,053 and 4,394,403. The iodonium salt can be a simple salt (for example, containing an anion such as $Cl^-$, $Br^-$, $I^-$ or $C_4H_5SO_3^-$) or a metal complex salt (for example, containing $SbF_6^-$, $PF_6^-$, $BF_4^-$, tetrakis(perfluorophenyl)borate, $SbF_5OH^-$ or $AsF_6^-$). Mixtures of iodonium salts can be used if desired.

Examples of useful aromatic iodonium complex salt photoinitiators include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodoniun hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc., 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, SarCat™ SR 1012 available from Sartomer Company), and mixtures thereof.

Useful chloromethylated triazines include those described in U.S. Pat. No. 3,779,778 (Smith et al.) at column 8, lines 45-50, which include 2,4-bis(trichloromethyl)-6-methyl-s-triazine, 2,4,6-tris(trichloromethyl)-s-triazine, and the more preferred chromophore-substituted vinylhalomethyl-s-triazines disclosed in U.S. Pat. Nos. 3,987,037 and 3,954,475 (Bonham et al.).

Useful diazonium salts include those described in U.S. Pat. No. 4,394,433 (Gatzke), which comprise a light sensitive aromatic moiety (for example, pyrrolidine, morpholine, aniline, and diphenyl amine) with an external diazonium group ($-N^+\equiv N$) and an anion (for example, chloride, triisopropyl naphthalene sulfonate, tetrafluoroborate, and the bis(perfluoroalkylsulfonyl)methides) associated therewith. Examples of useful diazonium cations include 1-diazo-4-anilinobenzene, N-(4-diazo-2,4-dimethoxy phenyl)pyrrolidine, 1-diazo-2,4-diethoxy-4-morpholino benzene, 1-diazo-4-benzoyl amino-2,5-diethoxy benzene, 4-diazo-2,5-dibutoxy phenyl morpholino, 4-diazo-1-dimethyl aniline, 1-diazo-N,N-dimethylaniline, 1-diazo-4-N-methyl-N-hydroxyethyl aniline, and the like.

Useful sulfonium salts include those described in U.S. Pat. No. 4,250,053 (Smith) at column 1, line 66, through column 4, line 2, which can be represented by the formulas:

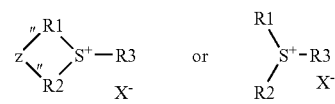

wherein $R_1$, $R_2$, and $R_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, and so forth) and alkyl groups having from 1 to about 20 carbon atoms. As used here, the term "alkyl" includes substituted alkyl (for example, substituted with such groups as halogen, hydroxy, alkoxy, or aryl). At least one of $R_1$, $R_2$, and $R_3$ is aromatic, and, preferably, each is independently aromatic. Z is selected from the group consisting of a covalent bond, oxygen, sulfur, $-S(=O)-$, $-C(=O)-$, $-(O=)S(=O)-$, and $-N(R)-$, where R is aryl (of about 6 to about 20 carbons, such as phenyl), acyl (of about 2 to about 20 carbons, such as acetyl, benzoyl, and so forth), a carbon-to-carbon bond, or $-R_4-)C(-R_5)-$, where $R_4$ and $R_5$ are independently selected from the group consisting of hydrogen, alkyl groups having from 1 to about 4 carbon atoms, and alkenyl groups having from about 2 to about 4 carbon atoms, and $X^-$ is as described below.

Suitable anions, $X^-$, for the sulfonium salts (and for any of the other types of photoinitiators) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)_2(C_4F_9SO_2)N^-$, $((CF_3)_2NC_2F_4SO_2)_2N^-$, $(CF_3)_2NC_2F_4SO_2C^-(SO_2CF_3)_2$, $(3,5\text{-bis}(CF_3)C_6H_3)SO_2N^-SO_2CF_3$, $C_6H_5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5\text{-bis}(CF_3)C_6H_3)_4B^-$, $(C_6F_5)_4B^-$, $(p\text{-}CF_3C_6H_4)_4B^-$, $(m\text{-}CF_3C_6H_4)_4B^-$, $(p\text{-}FC_6H_4)_4B^-$, $(C_6F_5)_3(CH_3)B^-$, $(C_6F_5)_3(n\text{-}C_4H_9)B^-$, $(p\text{-}CH_3C_6H_4)_3(C_6F_5)B^-$, $(C_6F_5)_3FB^-$, $(C_6H_5)_3(C_6F_5)B^-$, $(CH_3)_2(p\text{-}CF_3C_6H_4)_2B^-$, $(C_6F_5)_3(n\text{-}C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5\text{-bis}(CF_3)C_6H_3)_4B^-$, $(C_6F_5)_4B^-$, $(C_6F_5)_3(n\text{-}C_4H_9)B^-$, $(C_6F_5)_3FB^-$, and $(C_6F_5)_3(CH_3)B^-$.

Suitable anions containing other metal or metalloid centers include, for example, $(3,5\text{-bis}(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. The foregoing lists are not intended to be exhaustive, as other useful boron-centered nonnucleophilic salts, as well as other useful anions containing other metals or metalloids, will be readily apparent (from the foregoing general formulas) to those skilled in the art.

Preferably, the anion, $X^-$, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxathiinium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Preferred sulfonium salts include triaryl-substituted salts such as triarylsulfonium hexafluoroantimonate (for example, SarCat™ SR1010 available from Sartomer Company), triarylsulfonium hexafluorophosphate (for example, SarCat™ SR 1011 available from Sartomer Company), and triarylsulfonium hexafluoroantimonate (for example, SarCat™ K185 available from Sartomer Company).

Useful azinium salts include those described in U.S. Pat. No. 4,859,572 (Farid et al.) at column 8, line 51, through column 9, line 46, which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the photosensitizer to the azinium photoinitiator. In one preferred form, the quaternizing substituent is an oxy substituent. The oxy substituent, —O-T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)-$T^1$ radical, where $T^1$ can be any of the various alkyl and aralkyl radicals described above. In addition, $T^1$ can be an aryl radical, such as phenyl or naphthyl. The aryl radical can in turn be substituted. For example, $T^1$ can be a tolyl or xylyl radical. T typically contains from 1 to about 18 carbon atoms, with alkyl moieties in each instance above preferably being lower allyl moieties and aryl moieties in each instance preferably containing about 6 to about 10 carbon atoms. Highest activity levels have been realized when the oxy substituent, —O-T, contains 1 or 2 carbon atoms. The azinium nuclei need include no substituent other than the quaternizing substituent. However, the presence of other substituents is not detrimental to the activity of these photoinitiators.

Useful triarylimidazolyl dimers include those described in U.S. Pat. No. 4,963,471 (Trout et al.) at column 8, lines 18-28. These dimers include, for example, 2-(o-chlorophenyl)-4,5-bis(m-methoxyphenyl)-1,1'-biimidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred photoinitiators include iodonium salts (more preferably, aryliodonium salts), chloromethylated triazines, triarylimidazolyl dimers (more preferably, 2,4,5-triphenylimidazolyl dimers), sulfonium salts, and diazonium salts. More preferred are aryliodonium salts, chloromethylated triazines, and the 2,4,5-triphenylimidazolyl dimers (with aryliodonium salts and the triazines being most preferred).

Preparation of Photoreactive Composition

The reactive species, photoreactive photosensitizers, electron donor compounds, and photoinitiators can be prepared by the methods described above or by other methods known in the art, and many are commercially available. These four components can be combined under "safe light" conditions using any order and manner of combination (optionally, with stirring or agitation), although it is sometimes preferable (from a shelf life and thermal stability standpoint) to add the photoinitiator last (and after any heating step that is optionally used to facilitate dissolution of other components). Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The components of the photoinitiator system are present in photochemically effective amounts (as defined above). Generally, the composition contains at least about 5%, preferably at least about 10%, and more preferably, at least about 20%, by weight of one or more reactive species. Generally, the composition contains up to about 99.79%, preferably up to about 95%, and more preferably up to about 80%, by weight of one or more reactive species. Generally, the composition contains at least about 0.01%, preferably at least about 0.1%, more preferably, at least about 0.2%, by weight of one or more photosensitizers. Generally, the composition contains up to about 10%, preferably up to about 5%, and more preferably up to about 2%, by weight of one or more photosensitizers. Preferably, the composition contains at least about 0.1% by weight of one or more electron donors. Preferably, the composition contains up to about 10%, and preferably up to about 5%, by weight of one or more electron donors. Preferably, the composition contains at least about 0.1% by weight of one or more photoinitiators. Preferably, the composition contains up to about 10%, and preferably up to about 5%, by weight of one or more photoinitiators. When the reactive species is a leuco dye, the composition generally can contain at least about 0.01%, preferably at least about 0.3%, more preferably at least about 1%, and most preferably at least about 2%, by weight of one or more leuco dyes. When the reactive species is a leuco dye, the composition generally can contain up to about 10% by weight of one or more leuco dyes. These percentages are based on the total weight of solids, i.e., the total weight of components other than solvent.

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, medicaments (for example, leachable fluorides), and the like. The amounts and types of such adjuvants and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly(methyl methacrylate), poly(styrene)-co-(acrylonitrile), cellulose acetate butyrate, and the like.

Prior to exposure, the resulting photoreactive compositions can be coated on a substrate, if desired, by any of a variety of coating methods known to those skilled in the art (including, for example, knife coating and spin coating). The substrate can be chosen from a wide variety of films, sheets, and other surfaces, depending upon the particular application and the method of exposure to be utilized. Preferred substrates are generally sufficiently flat to enable the preparation of a layer of photoreactive composition having a uniform thickness. For applications where coating is less desirable, the photoreactive compositions can alternatively be exposed in bulk form.

Exposure System and its Use

Useful exposure systems include at least one light source (usually a pulsed laser) and at least one optical element. Suitable light sources include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts. However, in practice, any light source that provides sufficient intensity (to effect photoreactive absorption) at a wavelength appropriate for the photosensitizer (used in the photoreactive composition) can be utilized. Such wavelengths can generally be in the range of about 300 nm to about 1500 nm; preferably, from about 600 nm to about 1100 nm; more preferably, from about 750 nm to about 850 nm. Peak intensities can generally range from at least about $10^6$ W/cm$^2$. The upper limit on the pulse fluence (energy per pulse per unit area) is generally dictated by the ablation threshold of the photoreactive composition. For example, Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) can also be utilized. Preferred light sources are near infrared-pulsed lasers having a pulse length less than about 10 nanoseconds (more preferably, less than about 1 nanosecond; most preferably, less than about 10 picoseconds). Other pulse lengths can be used as long as the peak intensity and fluence criteria given above are met.

Optical elements useful in carrying out the method of the invention include refractive optical elements (for example, lenses and prisms), reflective optical elements (for example, retroreflectors or focusing mirrors), diffractive optical elements (for example, gratings, phase masks, and holograms), diffusers, Pockels cells, wave-guides, wave plates, birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20× Fluar).

Generally, exposure of the photoreactive composition can be carried out using a light source (as described above) along with an optical system as a means for controlling the three-dimensional spatial distribution of light intensity within the composition. For example, the light from a pulsed laser can be split into two parts and then recombined spatially and temporally at a location within the volume of the reactive composition. The focal point can be scanned or translated in a three-dimensional pattern that corresponds to a desired shape, thereby creating the desired shape. The exposed or illuminated volume of the composition can be scanned either by moving the composition itself or by moving the light source (for example, moving a laser beam using galvo-mirrors).

If the light induces, for example, a reaction of the reactive species that produces a material having solubility characteristics different from those of the reactive species, the resulting image can optionally be developed by removing either the exposed or the unexposed regions through use of an appropriate solvent, for example, or by other art-known means. Complex, three-dimensional objects can be prepared in this manner.

Exposure times generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity)), as well as upon the nature of the composition exposed (and its concentrations of photosensitizer, photoinitiator, and electron donor compound). Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ seconds (preferably, about $10^{-11}$ to $10^{-14}$ second) and about $10^2$ to $10^9$ pulses per second (preferably, about $10^3$ to $10^8$ pulses per second).

EXAMPLES

Objects and advantages of this invention are further illustrated by the following examples, but the particular materials and amounts thereof recited in these examples, as well as other conditions and details, should not be construed to unduly limit this invention.

Example 1

This example describes a method of separating a writing laser beam into multiple beams and combining the beams at the writing volume, thereby allowing an increase in two-photon writing intensity without the detrimental effects of one-photon absorption in the intervening volumes.

A test sample consisting of a 12.7 centimeters (cm) diameter polished glass wafer, thickness of 8 millimeters (mm), average surface roughness of 0.1 micrometer (μm), provides a base for a polymer coating. A thin layer of unreacted methyl methacrylate (MMA) with a 1% loading of a two-photon initiator (4,4-bis(diphenylamino)-trans-stilbene) covers the polished side of the glass wafer. The photoreactive coating consists of 40% by weight tris(2-hydroxyethylene) isocyanurate triacrylate, 59% by weight MMA, and 1% by weight two-photon absorber dissolved to 40% concentration in a dioxane solvent. This layer of photoreactive material is approximately 100 μm thick.

The ultrafast light source is a Spectra Physics Hurricane™ laser, operating at a wavelength of 800 nanometers (nm), pulse repetition rate of 80 megahertz (Mz), output power of 750 milliwatts (mW), and a nominal pulse width of 100 femtoseconds (fs). Light from this laser source travels through an optical train splitting the beam into multiple components and recombining the components through an imaging lens to the focal position of the lens. No individual component beam retraces the path of any other beam except at the focal point of the imaging lens. In order to minimize path length differences, a diffractive mask separates the incident beam into multiple beams. Recombination of the beams occurs in a confocal imaging system that focuses the individual beams within a cylindrical volume of approximately 10 μm radius. The individual beams overlap with good spatial and temporal characteristics. Micrometer adjustments of the imaging system bring the final focal position to coincide with the top surface of a sample. The sample moves relative to the laser beam through an X-Y stage system; the laser beam is stationary relative to the stage motion. Test patterns consist of linear lines approximately 5 centimeters (cm) long with adjacent lines spaced approximately 5 millimeters (mm) apart. Comparative examples using a single beam to photoreact the two-photon loaded MMA coating are accomplished by blocking all but one of the individual beams from the diffractive phase mask.

Exposure of the photoreactive composition on the covered glass wafer occurs by continuously moving the sample relative to the focal position of the imaging system. The sample stage moved uniformly at a speed of 100 micrometers per second (μm/s) past the light source. As the light source scans the phase mask, a single line was photopolymerized in the MMA-containing layer. Careful visual inspection of the sample in bright light reveals faint lines, due to a refractive index change between photopolymerized and unphotopolymerized material. Single and multiple beam photopolymerization experiments test the threshold for damaging the polymer due to one-photon absorption processes. Moreover, threshold experiments for 2-photon photopolymerization test both techniques for equivalence of the writing thresholds.

Sample exposure occurs at four levels of writing power: threshold, 25×-threshold, 50×-threshold, and 100× threshold, covering the range of conditions from initial photopolymerization to damaging the polymer arrangement.

Developing the polymerized coating in a dioxane solvent removes the unreacted regions from the glass wafer, revealing photoreacted lines. Each single line is approximately 20 μm thick and approximately 15 μm wide. The polymeric lines have good adhesion to the glass wafer. Table 1 expresses the results from these experiments.

TABLE 1

| Writing Power | Multiple Beam | Single Beam |
|---|---|---|
| Threshold | Photoreacted | Photoreacted |
| 25X Threshold | Photoreacted | Photoreacted |
| 50X Threshold | Photoreacted | Damage |
| 100X Threshold | Damage | Damage |

Example 2

Unless otherwise noted, chemicals used in Examples 2 and 3 are commercially available from Aldrich Chemical Co., Milwaukee, Wis. Tris(2-hydroxyethylene)isocyanurate triacrylate is commercially available from Sartomer Co., West Chester, Pa. under the tradename SR-368. SR-9008 is an alkoxylated trifunctional acrylate commercially available from Sartomer Company, Inc., West Chester, Pa.

The aromatic iodonium complex salts such as diphenyliodonium hexafluorophosphate may be prepared by metathesis of corresponding aromatic iodonium simple salts (such as, for example, diphenyliodonium bisulfate) in accordance with the teachings of Beringer et al., *J. Am. Chem. Soc.*, 81, 342 (1959). Thus, for example, the complex salt diphenyliodonium tetrafluoroborate is prepared by the addition at 60° C. of an aqueous solution containing 29.2 grams (g) silver fluoroborate, 2 g fluoroboric acid, and 0.5 g phosphorous acid in about 30 milliliters (mL) of water to a solution of 44 g (139 millimoles) of diphenyliodonium chloride. The silver halide that precipitates is filtered off and the filtrate concentrated to yield diphenyliodonium fluoroborate which may be purified by recrystallization.

The two-photon sensitizing dye, bis-[4-(diphenylamino) styryl]-1,4-(dimethoxy)benzene is prepared as follows: (1) Reaction of 1,4-bis-bromomethyl-2,5-dimethoxybenzene with triethylphosphite (Horner Eamons reagent): 1,4-bis-bromomethyl-2,5-dimethoxybenzene is prepared according to the literature procedure (Syper et. al., *Tetrahedron*, 1983, 39, 781-792). 1,4-bis-bromomethyl-2,5-dimethoxybenzene (253 g, 0.78 mol) is placed into a 1000-mL round bottom flask. Triethyl phosphite (300 g, 2.10 mol) is added. The reaction is heated to vigorous reflux with stirring for 48 hours under nitrogen atmosphere. The reaction mixture is cooled and the excess P(OEt)$_3$ is removed under vacuum using a Kugelrohr apparatus. The desired product is not actually distilled, but the Kugelrohr is used to remove the excess P(OEt)$_3$ by distilling it away from the product. Upon heating to 100° C. at 0.1 mmHg a clear oil results. Upon cooling the desired product solidifies. The product is suitable for use directly in the next step, and $^1$H NMR is consistent with the proposed structure. Recrystallization from toluene yields colorless needles and results in a purer product, but this is not necessary for subsequent steps in most cases. (2) Synthesis of Bis-[4-(diphenylamino)stryl]-1,4-(dimethoxy)benzene: A 1000-mL round bottom flask is fitted with a calibrated dropping funnel and a magnetic stirrer. The flask is charged with the product from the above synthesis (a Horner Eamons reagent) (19.8 g, 45.2 mal), and it is also charged with N,N-diphenylamino-p-benzaldehyde (Fluka, 25 g, 91.5 mmol). The flask is flushed with nitrogen and sealed with septa. Anhydrous tetrahydrofuran (750 mL) is cannulated into the flask and all solids dissolved. The dropping funnel is charged with KOtBu (potassium t-butoxide) (125 mL, 1.0 M in THF). The solution in the flask is stirred and the KOtBu solution is added to the contents of the flask over the course of 30 minutes. The solution is then left to stir at ambient temperature overnight. The reaction is then quenched by the addition of H$_2$O (500 mL). The reaction continues to stir and after about 30 minutes a highly fluorescent yellow solid forms in the flask. The solid is isolated by filtration and air-drying. It is then recrystallized from toluene (450 mL). The desired product is obtained as fluorescent needles (24.7 g, 81% yield). $^1$H NMR is consistent with the proposed structure.

The test substrate consists of a photoreactive composition coated on to one side of an optically transparent microscope slide. To promote polymer adhesion, a 2% solution of trimethoxysilylpropylmethacrylate in aqueous ethanol (pH of approximately 4.5) is spun coat on the substrates, which are then baked in a 130° C. oven for 10 min. A thin layer of the photoreactive composition (see Table 2), 40% by weight of solids in dioxane (available from Mallinckrodt Baker, Phillipsburg, N.J.), is then spun coat over the entire wafer and baked in an 80° C. oven to remove the solvent. The final layer of photoreactive coating is approximately 60 μm thick.

TABLE 2

Photoreactive composition for Example 2 & 3

| Ingredient | Weight % |
|---|---|
| Poly(styrene-co-acrylonitrile) (MW ~165,000 g/mol) | 26.55 |
| SR-368 (Sartomer Co., West Chester, PA) | 35.40 |
| SR-9008 (Sartomer Co., West Chester, PA) | 35.40 |
| Diphenyliodonium hexafluorophosphate | 1.77 |
| Bis-[4-(diphenylamino)styryl]-1,4-(dimethoxy)benzene | 0.88 |

The light source used for Examples 2 and 3 is a diode pumped Ti:sapphire laser (Spectra-Physics) operating at a wavelength of 800 nm, pulse width 100 fs, pulse repetition rate of 80 MHz, beam diameter of approximately 2 mm, and an average output power of 860 mW. The optical train (similar to the diagram of FIG. 1a) splits the original light beam into two parts by use of a beam splitter. Low-dispersion mirrors are used to steer the beams toward the sample; a translation stage containing one or more mirrors provides adjustment for precise matching of pathlengths. Optical attenuators (located in each beam path) are used to vary the optical power of the beams. Aspheric lenses (focal length=15.36 mm, NA=0.16) are used to focus each beam into the photoreactive composition. The two beams have linear polarization states that are parallel when the beams are combined.

For these test substrates, photoreacting is accomplished by superimposing the focal spots formed by each objective lens at the substrate/polymer interface. Overlap of the focal spots in time and space is verified by observation of the intensity of fluorescence from the photoreactive reactive composition. The situation where the beams overlap in space (but not time) is demonstrated by a doubling of the fluorescence (compared to the fluorescence resulting from a single beam). When ideal conditions are reached (and the beams overlap in space and time) a quadrupling of the fluorescence is observed. The optical power in each beam is then reduced until the photoreactive reaction occurs only for overlap in space and time; individual beams do not cause a reaction.

Exposure of the photoreactive composition covered sample occurs by continuously moving the sample such that the superimposed focal spots always remained at the substrate/polymer interface. The test structures consist of continuously scanned lines that are 0.5 to 5 cm long with 0.0625 cm spacing between the lines, with all lines lying in the same plane. Each line is the result of a single pass of energy from the laser. Developing the reacted polymeric coating using N,N-dimethyl formamide removes the unreacted regions from the substrate, revealing photoreacted lines. Moreover, the photoreacted lines exhibit good adhesion to the substrate.

In this example (as shown in FIG. 1a), the two beams are incident from the same side of the photoreactive reactive composition. The angle between the two beams is varied from nearly zero (limited by the ability of the objective lenses to be brought into close proximity to each other) to nearly 180 degrees (limited by the ability of the objective lenses to be brought into close proximity to the photoreactive composition). As described in the detailed description of preferred embodiments, changing the direction from which the beams are incident allows the reacting of volumetric regions having different shapes.

Example 3

In this example the sample preparation, laser source and optical train are identical to those described above in Example 2. In this case the photoreactive composition is placed between the focusing lenses (as shown in FIG. 1b) so that the light beams are incident upon the reacting region from opposite sides of the substrate. The angle between the incident beams (170a and 170b in FIG. 1b) is varied from nearly zero (both beams arrive at glancing angles to the substrate) to nearly, but not quite, 180 degrees. As described in the detailed description of preferred embodiments, changing the direction from which the beams are incident allows the reacting of volumetric regions having different shapes.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method for enhancing photoreactive absorption in a specified volume element of a photoreactive composition, the method comprising:
   providing a photoreactive composition;
   providing a source of light sufficient for simultaneous absorption of at least two photons by the photoreactive composition, the light source having a beam capable of being divided;
   dividing the light beam into a plurality of equal path length exposure beams;
   focusing the exposure beams in a substantially non-counter propagating manner at a single volume element of the photoreactive composition simultaneously to effect simultaneous absorption of at least two photons by the photoreactive composition and reaction of at least a portion of the photoreactive composition;
   scanning the photoreactive composition and/or the single volume element relative to each other in at least two directions to form a three-dimensional pattern; and
   wherein the photoreactive composition is exposed with the single volume element, wherein the single volume element is approximately symmetrical, being formed with a laser intensity such that it has no dimension less than the cross-section of a diffraction-limited spot produced by 800-nm light with a 0.75 NA objective.

2. The method of claim 1 wherein the photoreactive composition further comprises a nonreactive species.

3. The method of claim 1 wherein the photoreactive composition comprises a photoreactive species.

4. The method of claim 1 wherein the photoreactive composition comprises a photoreactive photosensitizer.

5. The method of claim 1 wherein the photoreactive composition comprises an electron donor compound.

6. The method of claim 1 wherein the photoreactive composition comprises a photoinitiator.

7. The method of claim 1 wherein the photoreactive composition comprises about 5% to about 99.79% by weight of the at least one reactive species, about 0.01% to about 10% by weight of the at least one photoreactive photo sensitizer, up to about 10% by weight of the at least one electron donor compound, and about 0.1% to about 10% by weight of the at least one photoinitiator, based upon the total weight of solids.

8. The method of claim 1 wherein the light source comprises a pulsed laser.

9. The method of claim 1 wherein focusing the exposure beams in a substantially non-counter propagating manner comprises directing a plurality of exposure beams from the same side of the photoreactive composition.

10. The method of claim 1 wherein the approximately symmetrical single volume element has no dimension greater than that obtainable by a 200-femtosecond pulse width.

11. A method for reacting a photoreactive composition, the method comprising:
    providing a photoreactive composition, wherein the photoreactive composition is capable of simultaneous absorption of two or more photons;
    exposing the photoreactive composition to laser light from a plurality of substantially non-counter propagating directions simultaneously to effect simultaneous absorption of at least two photons by the photoreactive composition and reaction of at least a portion of the photoreactive composition, wherein the light overlaps in time and space at a single predetermined focus spot; and
    scanning the photoreactive composition and/or the focus spot relative to each other in at least two directions to form a three-dimensional pattern in the photoreactive composition;
    wherein reaction of at least a portion of the photoreactive composition comprises polymerization, depolymerization, crosslinking, deprotection, rearrangement, an acid-induced reaction, or a free radical-induced reaction; and
    wherein the photoreactive composition is exposed with the focus spot, wherein the focus spot is approximately symmetrical being formed with a laser intensity such that it has no dimension less than the cross-section of a diffraction-limited spot produced by 800-nm light with a 0.75 NA objective.

12. The method of claim 11 wherein the photoreactive composition further comprises a nonreactive species.

13. The method of claim 11 wherein the photoreactive composition comprises a photoreactive species.

14. The method of claim 11 wherein the photoreactive composition comprises a photoreactive photosensitizer.

15. The method of claim 11 wherein the photoreactive composition comprises an electron donor compound.

16. The method of claim 11 wherein the photoreactive composition comprises a photoinitiator.

17. The method of claim 11 wherein the photoreactive composition comprises about 5% to about 99.79% by weight of the at least one reactive species, about 0.01% to about 10% by weight of the at least one photoreactive photosensitizer, up to about 10% by weight of the at least one electron donor compound, and about 0.1% to about 10% by weight of the at least one photoinitiator, based upon the total weight of solids.

18. The method of claim 11 wherein the laser comprises a pulsed laser.

19. The method of claim 11 wherein exposing the photoreactive composition comprises exposing the photoreactive composition to laser light from a plurality of directions from the same side of the photoreactive composition.

20. A method for enhancing photoreactive absorption in a specified volume element of a photoreactive composition, the method comprising:
    providing a photoreactive composition;
    providing light sufficient for simultaneous absorption of at least two photons by the photoreactive composition; the light comprising at least two exposure beams;
    focusing the exposure beams in a substantially non-counter propagating manner at a single volume element of the photoreactive composition simultaneously to effect simultaneous absorption of at least two photons by the photoreactive composition and reaction of at least a portion of the photoreactive composition; and scanning the photoreactive composition and/or the single volume element relative to each other in at least two directions to form a three-dimensional pattern;

wherein reaction of at least a portion of the photoreactive composition comprises polymerization, depolymerization, crosslinking, deprotection, rearrangement, an acid-induced reaction, or a free radical-induced reaction; and wherein the photoreactive composition is exposed with the single volume element, wherein the single volume element is approximately symmetrical being formed with a laser intensity such that it has no dimension less than about the cross-section of a diffraction-limited spot produced by 800-nm light with a 0.75 NA objective.

21. The method of claim 20 wherein the light is provided by one or more lasers.

22. The method of claim 21 wherein each laser provides at least one exposure beam.

23. The method of claim 20 further comprising providing optical delay elements to control the relative delay between each pulse and the location of the focal point of each beam.

24. The method of claim 20 wherein focusing the exposure beams in a substantially non-counter propagating manner comprises directing at least two exposure beams from the same side of the photoreactive composition.

25. A method for enhancing photoreactive absorption in a specified volume element of a photoreactive composition, the method comprising:

providing a photoreactive composition;

providing a source of light sufficient for simultaneous absorption of at least two photons by the photoreactive composition, the light source having a beam capable of being divided;

dividing the light beam into a plurality of equal path length exposure beams;

focusing the exposure beams in a substantially non-counter propagating manner at a single volume element of the photoreactive composition simultaneously to effect simultaneous absorption of at least two photons by the photoreactive composition and reaction of at least a portion of the photoreactive composition; and scanning the photoreactive composition and/or the single volume element relative to each other in a manner to destroy any pattern in the photoreactive composition generated by any interference between the exposure beams;

wherein the photoreactive composition is exposed with the single volume element, wherein the single volume element is approximately symmetrical being formed with a laser intensity such that it has no dimension less than about the cross-section of a diffraction-limited spot produced by 800-nm light with a 0.75 NA objective.

26. The method of claim 25 wherein focusing the exposure beams in a substantially non-counter propagating manner comprises directing a plurality of exposure beams from the same side of the photoreactive composition.

27. A method for reacting a photoreactive composition, the method comprising:

providing a photoreactive composition capable of simultaneous absorption of two or more photons;

exposing the photoreactive composition to laser light from a plurality of substantially non-counter propagating directions simultaneously to effect simultaneous absorption of at least two photons by the photoreactive composition and reaction of at least a portion of the photoreactive composition, wherein the light overlaps in time and space at a single predetermined focus spot; and scanning the photoreactive composition and/or the focus spot relative to each other in a manner to destroy any pattern in the photoreactive composition generated by any interference in the directional laser light;

wherein reaction of at least a portion of the photoreactive composition comprises polymerization, depolymerization, crosslinking, deprotection, rearrangement, an acid-induced reaction, or a free radical-induced reaction; and wherein the photoreactive composition is exposed with the focus spot, wherein the focus spot is approximately symmetrical being formed with a laser intensity such that it has no dimension less than the cross-section of a diffraction-limited spot produced by 800-nm light with a 0.75 NA objective.

28. The method of claim 27 wherein exposing the photoreactive composition comprises exposing the photoreactive composition to laser light from a plurality of directions from the same side of the photoreactive composition.

29. A method for enhancing photoreactive absorption in a specified volume element of a photoreactive composition, the method comprising:

providing a photoreactive composition;

providing light sufficient for simultaneous absorption of at least two photons by the photoreactive composition; the light comprising at least two exposure beams;

focusing the exposure beams in a substantially non-counter propagating manner at a single volume element of the photoreactive composition simultaneously to effect simultaneous absorption of at least two photons by the photoreactive composition and reaction of at least a portion of the photoreactive composition; and scanning the photoreactive composition and/or the single volume element relative to each other in a manner to destroy any pattern in the photoreactive composition generated by any interference between the exposure beams;

wherein reaction of at least a portion of the photoreactive composition comprises polymerization, depolymerization, crosslinking, deprotection, rearrangement, an acid-induced reaction, or a free radical-induced reaction; and wherein the photoreactive composition is exposed with the single volume element, wherein the single volume element is approximately symmetrical being formed with a laser intensity such that it has no dimension less than the cross-section of a diffraction-limited spot produced by 800-nm light with a 0.75 NA objective.

30. The method of claim 29 wherein focusing the exposure beams in a substantially non-counter propagating manner comprises directing at least two exposure beams from the same side of the photoreactive composition.

31. A method for controlling the shape of a volume element of a photoreactive composition, the method comprising:

providing a photoreactive composition;

providing a source of light sufficient for simultaneous absorption of at least two photons by the photoreactive composition, the light source having a beam capable of being divided;

dividing the light beam into a plurality of equal path length exposure beams;

focusing the exposure beams with an NA of no greater than 0.16 in a substantially non-counter propagating manner at a single volume element of the photoreactive composition simultaneously to effect simultaneous absorption of at least two photons by the photoreactive composition and reaction of at least a portion of the photoreactive composition; and scanning the photoreactive composition and/or the single volume element relative to each other in at least two directions to form a three-dimensional pattern; and wherein the photoreactive composition is exposed with the single volume element, wherein the single volume element is approximately symmetrical being formed with a laser intensity such that it has no dimension less than the cross-section of a diffraction-limited spot produced by 800-nm light with a 0.75 NA objective.

32. The method of claim 31 wherein the single volume element has a shape determined by the crossing region of the non-counter propagating beams.

* * * * *

UNITED STATES PATENT AND TRADEMARK OFFICE
CERTIFICATE OF CORRECTION

| | | |
|---|---|---|
| PATENT NO. | : 7,790,353 B2 | Page 1 of 2 |
| APPLICATION NO. | : 10/297961 | |
| DATED | : September 7, 2010 | |
| INVENTOR(S) | : Fleming et al. | |

It is certified that error appears in the above-identified patent and that said Letters Patent is hereby corrected as shown below:

<u>First Page</u>
Column 1, Item (60) (Related U.S. Application Data); Line 1, Delete "60/211,675" and insert -- 60/211,708 --, therefor.

<u>Column 13</u>
Line 41; Delete "-4-N-" and insert -- -4-(N- --, therefor.

<u>Column 15</u>
Line 34; Delete "mm can" and insert -- film can --, therefor.
Line 35; Delete "carefullly" and insert -- carefully --, therefor.

<u>Column 29</u>
Line 45; Delete "thereof " and insert -- thereof. --, therefor.

<u>Column 31</u>
Line 66; Delete "iodoniun" and insert -- iodonium --, therefor.

<u>Column 33</u>
Line 9; Delete "$(CF_3SO_2)_2(C_4F_9SO_2)N^-$" and insert -- $(CF_3SO_2)(C_4F_9SO_2)N^-$ --, therefor.

<u>Column 34</u>
Line 41; Delete "allyl" and insert -- alkyl --, therefor.

<u>Column 37</u>
Line 64; Delete "(Mz)" and insert -- (MHz) --, therefor.

<u>Column 42</u>
Line 29-30; Claim 11, delete "symmetrical" and insert -- symmetrical, --, therefor.

Signed and Sealed this
Twenty-eighth Day of June, 2011

David J. Kappos
*Director of the United States Patent and Trademark Office*

CERTIFICATE OF CORRECTION (continued)
U.S. Pat. No. 7,790,353 B2

Column 43
Line 12; Claim 20, delete "symmetrical" and insert -- symmetrical, --, therefor.
Line 50; Claim 25, delete "symmetrical" and insert -- symmetrical, --, therefor.

Column 44
Line 12-13; Claim 27, delete "symmetrical" and insert -- symmetrical, --, therefor.
Line 46; Claim 29, delete "symmetrical" and insert -- symmetrical, --, therefor.

Column 46
Line 1; Claim 31, delete "symmetrical" and insert -- symmetrical, --, therefor.